United States Patent
Ando et al.

(10) Patent No.: US 6,495,841 B1
(45) Date of Patent: Dec. 17, 2002

(54) CHARGED BEAM DRAWING APPARATUS

(75) Inventors: Atsushi Ando, Tokyo (JP); Shunko Magoshi, Yokohama (JP); Kazuyoshi Sugihara, Miura-gun (JP); Yuichiro Yamazaki, Tokyo (JP); Motosuke Miyoshi, Tokyo (JP); Katsuya Okumura, Yokohama (JP); Kiyoshi Hattori, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/299,145

(22) Filed: Apr. 26, 1999

(30) Foreign Application Priority Data

Apr. 27, 1998 (JP) .......................................... 10-116732
Sep. 11, 1998 (JP) .......................................... 10-258716
Mar. 19, 1999 (JP) .......................................... 11-076056

(51) Int. Cl.$^7$ ............................................. H01J 37/317
(52) U.S. Cl. ................................. 250/492.23; 250/398
(58) Field of Search ............................ 250/492.23, 398

(56) References Cited

U.S. PATENT DOCUMENTS

| | | | |
|---|---|---|---|
| 4,376,249 A | 3/1983 | Pfeiffer et al. | ............... 250/398 |
| 4,827,127 A * | 5/1989 | Todokoro | .................... 250/398 |
| 4,963,748 A * | 10/1990 | Szilagyi | ....................... 250/398 |
| 5,153,441 A * | 10/1992 | Moriizumi | ............. 250/492.23 |

OTHER PUBLICATIONS

Eiichi Goto and Takashi Soma "MOL (moving objective lens) Formulation of Deflective Aberration Free System" Optik 48 No. 3, p. 255–270, 1977.

* cited by examiner

Primary Examiner—Jack Berman
(74) Attorney, Agent, or Firm—Finnegan, Henderson, Farabow, Garrett & Dunner, L.L.P.

(57) ABSTRACT

In an electron beam drawing apparatus including an objective lens for focusing an electron beam emitted from an electron gun on a sample surface and an objective deflector for controlling the position of the electron beam on the sample surface, an objective driving mechanism for mechanically moving the objective lens and objective deflector in a plane perpendicular to the optical axis of the electron beam is provided and an optical axis shifting deflector arranged nearer to the electron gun than the objective lens and objective deflector, for deflecting the electron beam in synchronism with the operation of the objective lens and objective deflector is provided.

8 Claims, 18 Drawing Sheets

AREA DRAWN BY
ONE SHOT
(TOP VIEW)

AREA DRAWN BY
OBJECTIVE DEFLECTION
(TOP VIEW)

125 FIG. 12B

403: ONE MAIN DEFLECTION LINE
(50 μm × 500 μm)
= 10 SUB-DEFLECTION AREA

402: ONE SUB-DEFLECTION
AREA (50 μm × 50 μm) = 25 SHOT

401: ONE SHOT
(10 μm × 10 m)

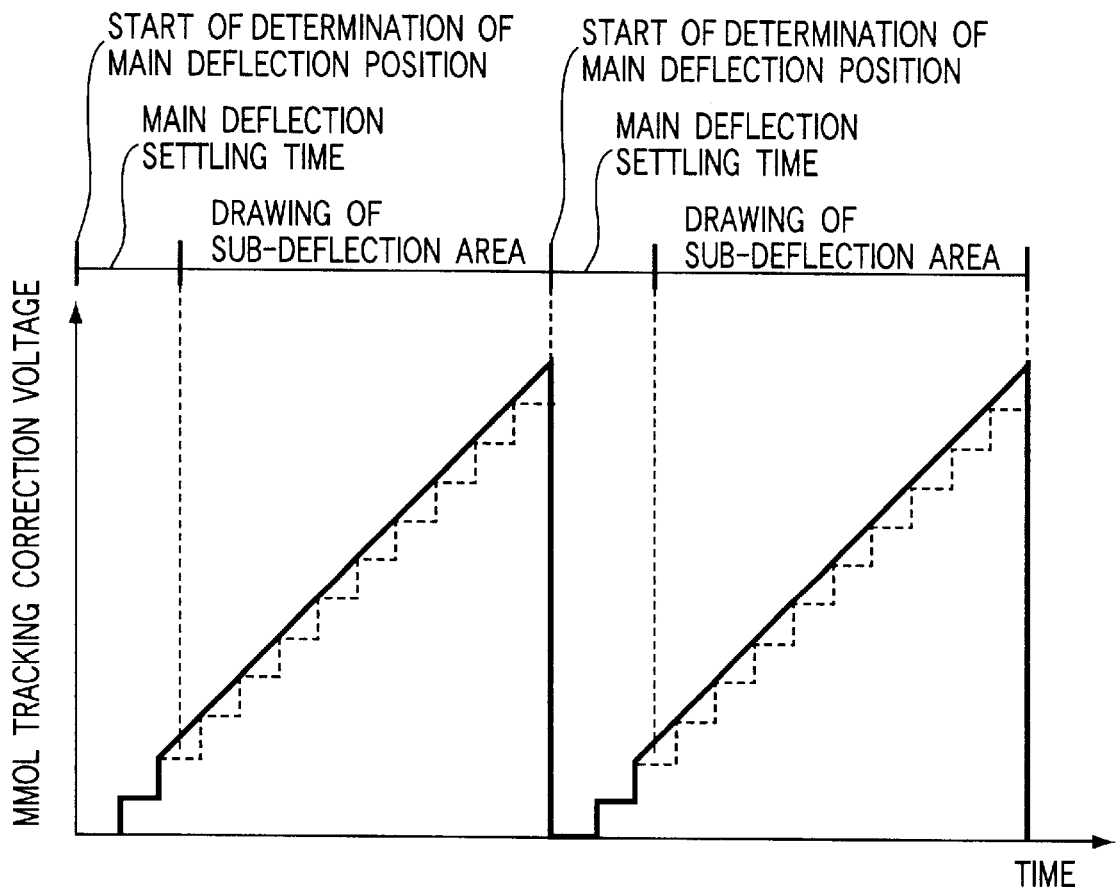
F I G. 23

CHARGED BEAM DRAWING APPARATUS

BACKGROUND OF THE INVENTION

This invention relates to a charged beam drawing apparatus for forming a fine element pattern for a semiconductor integrated circuit or the like on a substrate such as a semiconductor wafer or a pattern transferring mask by use of a charged beam, and more particularly to a charged beam drawing apparatus having a mechanism for mechanically moving an objective lens and objective deflector.

In an electron beam lithography in the semi-conductor manufacturing process, it is proved that the process to 0.01 μm can be attained by use of a finely converged beam. From the viewpoint of miniaturization, no problem will occur for the time being, but a problem occurs in the throughput as a device mass production tool. That is, in the electron beam lithography, since fine patterns are sequentially drawn one by one, the pattern drawing time becomes long. In order to reduce the drawing time, several devices such as a cell projection system for partially and simultaneously drawing a repeated pattern portion of a ULSI pattern are developed. However, it cannot catch up with the throughput of the optical lithography even by use of the above devices.

As one method for increasing the throughput of the electron beam lithography, an attempt is made to enlarge the deflection area of the objective deflector in the electron beam drawing apparatus and deflect the beam at high speed. In this case, the drawing throughput is enhanced, but since the deflection area becomes large, a degradation in the resolution occurs and the pattern will be distorted due to the lens aberration or deflection aberration. Therefore, the high precision drawing cannot be attained. Further, an electrostatic type deflector is used for deflecting the beam at high speed. The deflection area and a voltage applied to the electrostatic deflector have a preset relation, and if a voltage applied to the electrostatic deflector becomes high to deflect the beam to a large extent, it becomes difficult to deflect the beam at high speed.

Thus, in the prior art, in the electron beam drawing apparatus, if the deflection area of the objective deflector is enlarged to enhance the throughput, a degradation in the resolution occurs and the pattern will be distorted due to the lens aberration or deflection aberration, and therefore, the drawing with high precision cannot be attained. Further, it is difficult to cover the large deflection area by use of the high-speed deflectable type electro-static deflector. The above problem occurs not only in the electron beam drawing apparatus, but also in an ion beam drawing apparatus for drawing a pattern by use of an ion beam.

BRIEF SUMMARY OF THE INVENTION

This invention has been made in order to solve the above problem and an object of this invention is to provide a charged beam drawing apparatus capable of suppressing occurrence of distortion of a pattern and a degradation in the beam resolution caused by an increase in the deflection area and enhancing the throughput and drawing precision.

The above object can be attained by a charged beam drawing apparatus comprising a condenser lens for adjusting a charged beam emitted from a charged beam source to a desired size and brightness; an objective lens for focusing the charged beam on a sample surface; an objective deflector for controlling the position of the charged beam on the sample surface; a driving mechanism for mechanically moving the objective lens and objective deflector in a preset plane (for example, in a plane perpendicular to the optical axis of the charged beam); and an optical axis shifting deflector arranged nearer to the charged beam source than the objective lens and objective deflector, for deflecting the charged beam in synchronism with the operation of the driving mechanism.

Further, the above object can be attained by a charged beam drawing apparatus comprising a condenser lens for adjusting a charged beam emitted from a charged beam source to a desired current density; a character mask having a plurality of different aperture patterns, for selecting one of the aperture patterns to form a charged beam corresponding to the selected aperture pattern; an objective lens for forming an image on a sample surface based on the charged beam formed by the character mask; an objective deflector for controlling the position of the charged beam on the sample surface; a driving mechanism for moving the character mask, objective lens and objective deflector in a preset plane (for example, in a plane perpendicular to the optical axis of the charged beam); and an optical axis shifting deflector arranged nearer to the charged beam source than the character mask, for deflecting the charged beam in synchronism with the operation of the driving mechanism.

In the charged beam drawing apparatus, if the defection area by the objective deflector is enlarged, the deflection aberration becomes large and the beam orbit with respect to the objective lens is greatly deviated from the lens center, and as a result, the lens aberration becomes large. Therefore, in this invention, an attempt is made to mechanically move the objective lens and objective deflector in a direction perpendicular to the optical axis. Deviation of the axes of the objective lens and objective deflector from the optical axis caused by the mechanical movement of the objective lens and objective deflector is corrected by use of the optical axis shifting deflector provided in the preceding stage of the objective lens and objective deflector.

Therefore, according to this invention, since the total deflection area can be enlarged without enlarging the electrical deflection area by the objective deflector itself, the deflection aberration can be made small. Further, since the deflection area by the objective deflector itself is small, the lens aberration by the objective lens can be made small. Therefore, occurrence of the pattern distortion and the degradation in the beam resolution due to an increase in the deflection area can be prevented and the drawing precision can be made high together with the throughput. Particularly, this invention is effective when an electrostatic lens is used as the objective lens and an electrostatic deflector is used as the objective deflector in a low-acceleration electron beam drawing apparatus.

Further, a large number of opening patterns (aperture group) can be arranged in the mask by providing the driving mechanism for mechanically moving the forming aperture mask or character mask. As a result, the drawing throughput can be further enhanced.

Further, control for the mechanical movement of the objective lens and objective deflector can be made simple by controlling the driving mechanism to continuously change the moving speed of the objective lens and objective deflector. In addition, in a case where the driving mechanism is driven by use of a sinusoidal wave or the like, the beam is electrically deflected by the objective deflector in synchronism with the sinusoidal driving operation in order to compensate for a difference of the speed of movement by the driving mechanism with respect to a constant reference speed. As a result, a lowering in the throughput caused by using the sinusoidal wave for driving the driving mechanism can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12B is a simulated view showing the aperture group formed in the mask;

FIG. 23 is a simulated diagram showing a variation in the MMOL tracking correction voltage in the sixth embodiment.

DETAILED DESCRIPTION OF THE INVENTION

There will now be described embodiments of this invention with reference to the accompanying drawings.

(First Embodiment)

Figure 1:
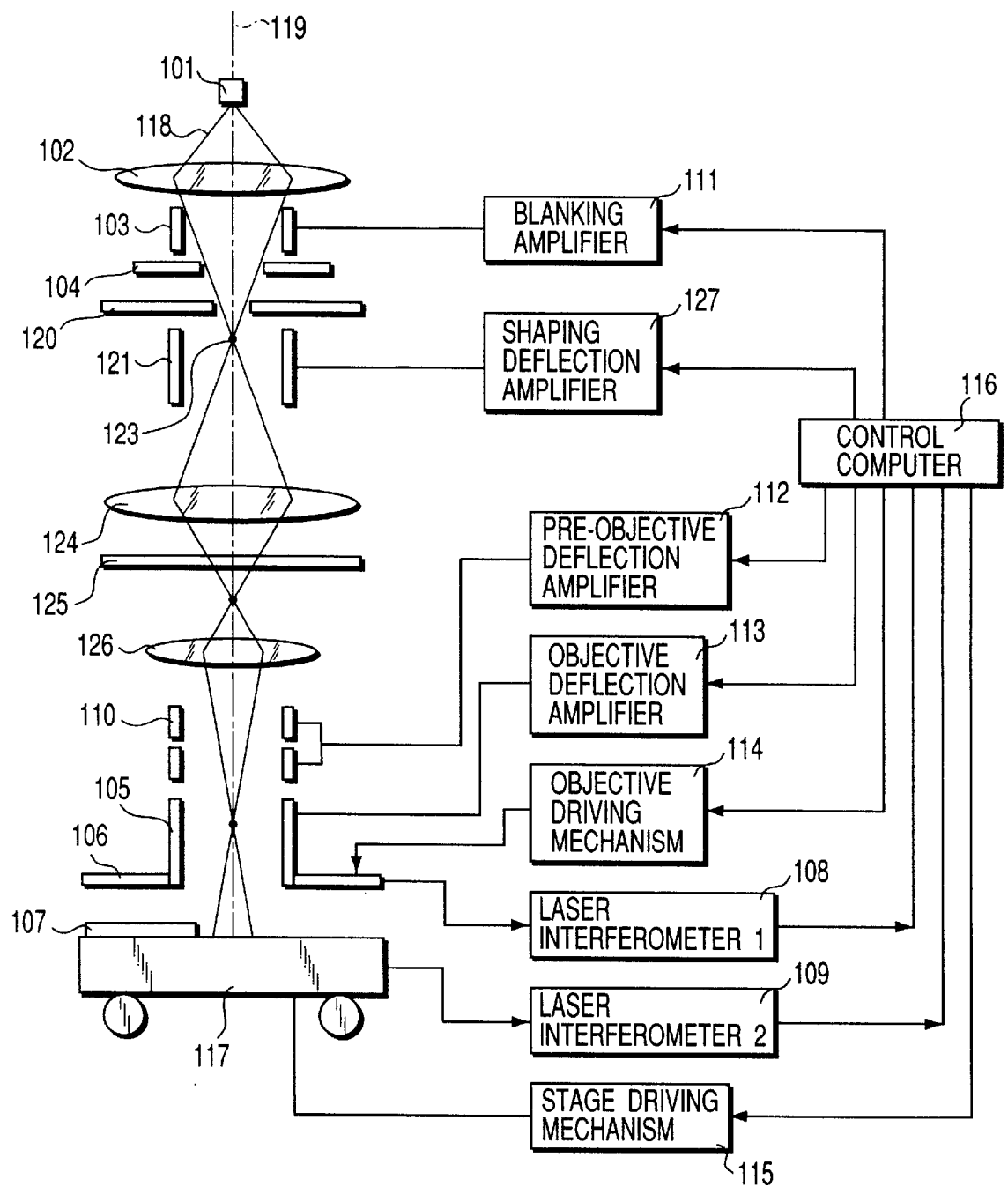
FIG. 1 is a schematic construction view showing an electron beam drawing apparatus according to a first embodiment of this invention.

FIG. 1 is a schematic construction view showing an electron beam drawing apparatus according to a first embodiment of this invention.

The size and brightness (current density) of an electron beam 118 emitted from an electron gun 101 are adjusted by a condenser lens 102 and the electron beam is uniformly applied to a first aperture mask 120. An aperture image of the first shaping aperture mask 120 is formed on a second shaping aperture mask 125 by use of a projection lens 124. The degree of optical overlapping of the apertures of the two aperture masks 120 and 125 is controlled by a shaping deflector 121. The shaping deflector 121 is controlled by a deflection voltage supplied from a shaping deflection amplifier 127.

The electron beam 118 formed by the optical overlapping of the apertures of the first and second aperture masks 120 and 125 is reduced by a reduction lens 126 and objective lens 106 and forms an image on a sample 107. The position of the electron beam 118 on the sample surface is controlled by an objective deflection amplifier 113 for applying a voltage to an objective deflector 105.

The objective deflector 105 and objective lens 106 are integrally formed to form an objective lens deflector as will be described later and moved by an objective driving mechanism 114 movable in X and Y directions perpendicular to the optical axis (Z direction). The movement position of the objective lens deflector 105, 106 is measured by use of a first laser interferometer 108. Further, in the preceding stage of the objective lens deflector 105, 106, a pre-objective lens deflector 110 which will be described later is arranged and a deflection voltage is applied to the deflector 110 by a pre-objective lens deflection amplifier 112.

The sample 107 is placed on a stage 117 movable in the X and Y directions and the stage 117 is driven by a stage driving mechanism 115. The movement position of the stage 117 is measured by use of a second laser interferometer 109.

When the position of the electron beam 108 on the sample 107 is moved, it is necessary not to expose an unnecessary portion on the sample 107. For this purpose, the electron beam 118 is deflected by use of a blanking deflector 103 so that the electron beam 118 may be cut off by a blanking aperture 104 and will not reach the sample surface. The deflection voltage to the blanking deflector 103 is controlled by a blanking amplifier 111. All of the amplifiers 111, 112, 113, 127 and the driving mechanisms 114, 115 are controlled by a control computer 116.

Figure 2A:
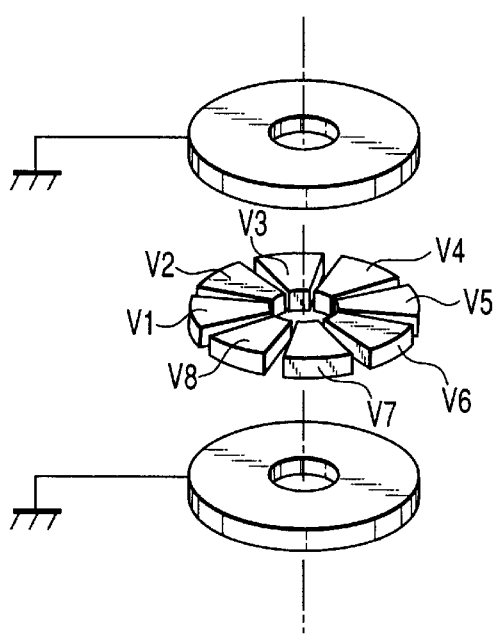
FIG. 2A is an exploded perspective view showing the constructions of an electrostatic lens and electrostatic deflector used in the first embodiment.

Next, the construction of the objective lens portion is explained in detail. The feature of this embodiment is that the objective lens deflector 105, 106 is formed of an electrostatic type and the structure having one electrode used as the objective lens deflector 105, 106 can be moved in a direction perpendicular to the optical axis by use of the objective driving mechanism 114. As shown in FIG. 2A, the objective lens deflector 105, 106 is constructed by a three-pole structure having an octapole formed of eight electrodes and two ground electrodes holding the octapole therebetween. The octapole is applied with electrode voltages of V1 to V8 by the control computer 116. The voltages are applied to the objective lens deflector 105, 106 via the objective deflection amplifier 113 so as to permit the objective lens deflector 105, 106 to be used as an electrostatic lens and an electrostatic deflector.

Figure 2B:
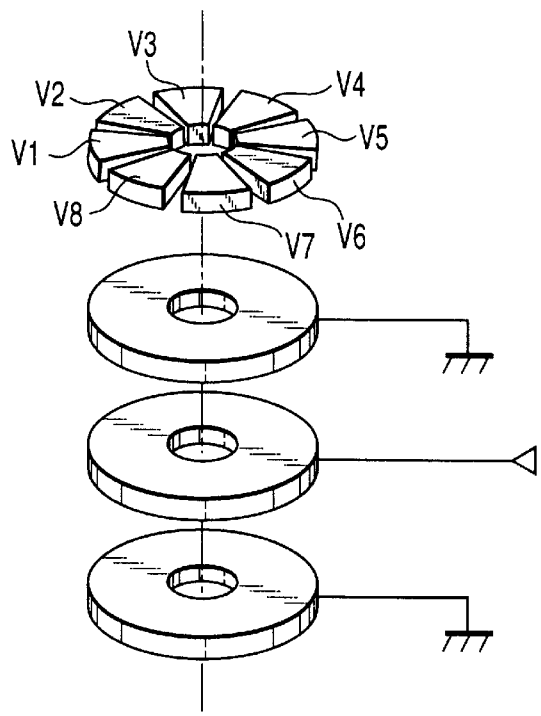
FIG. 2B is an exploded perspective view showing the constructions of an electrostatic lens and electrostatic deflector used in the first embodiment.

The construction of the objective lens deflector 105, 106 is not limited to that shown in FIG. 2A, but it is possible to construct an electrostatic lens by use of three electrode plates arranged along the optical axis direction and construct an electrostatic deflector by an octapole having eight electrodes as shown in FIG. 2B.

Figure 3A:
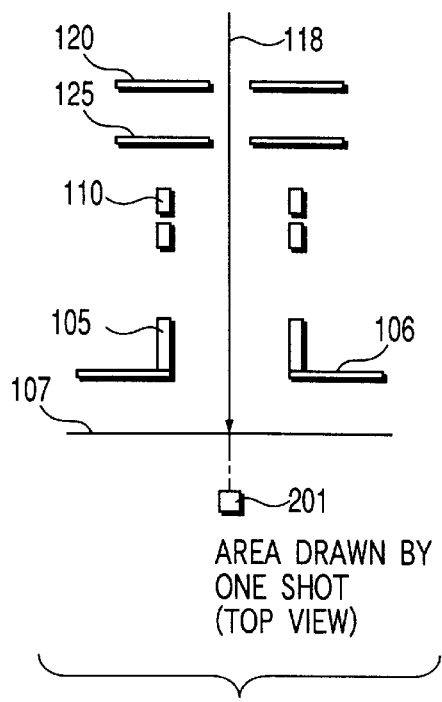
FIG. 3A is a simulated view for illustrating an area to be drawn by one shot without driving and deflection of the objective deflector.

Next, the position setting method of the electron beam 118 on the sample surface is explained in detail. First, as shown in FIG. 3A, the electron beam 118 shaped by the first and second shaping aperture masks 120 and 125 is applied to the position (shot position) on the sample 107 by use of the objective lens deflector 105, 106. Then, an image with a size (shot size 201) of the thus formed electron beam 118 is drawn.

Figure 3B:
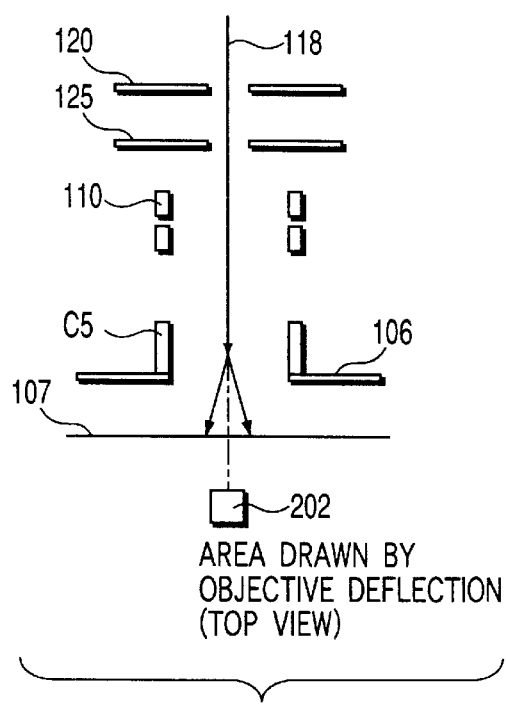
FIG. 3B is a simulated view for illustrating an area to be drawn when deflection by the objective deflector is used.

As shown in FIG. 3B, a deflection area 202 of the objective lens deflector 105, 106 is sequentially and two-dimensionally drawn by changing the supply voltage to the objective lens deflector 105, 106 to change the shot position. The deflection area 202 of the objective lens deflector 105, 106 is determined by restrictions (aberration, distortion and the like) on calculations in an electronic optical system used. The throughput of the drawing apparatus is enhanced by increasing the area 202, but since the aberration or the like is increased, it becomes difficult to attain high-precision drawing.

Figure 3C:
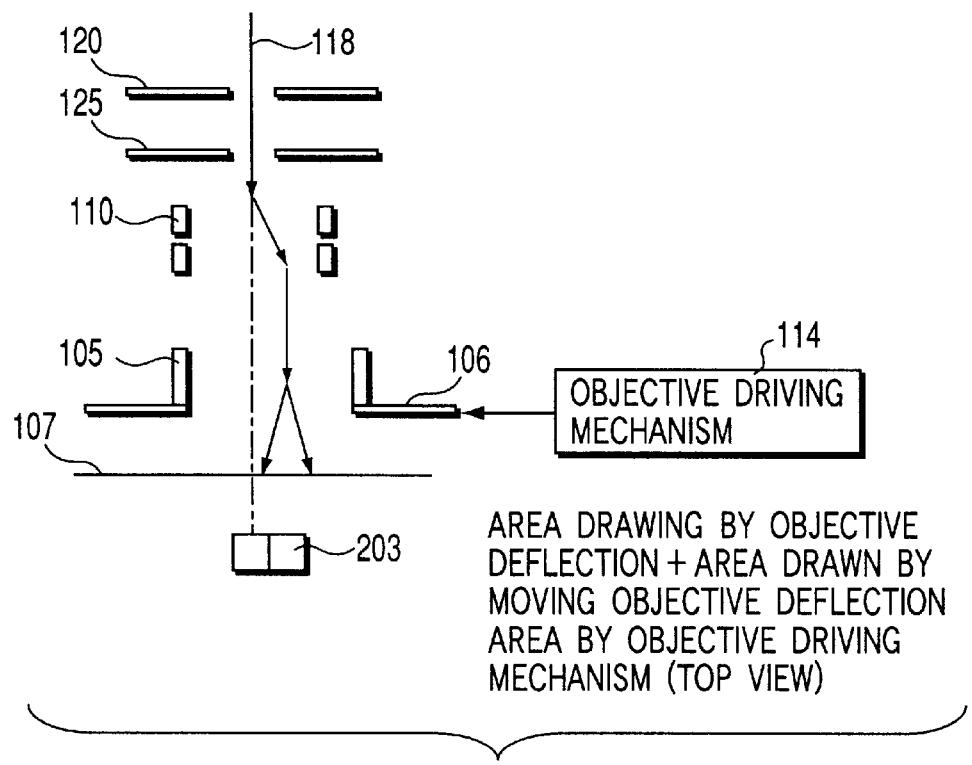
FIG. 3C is a simulated view for illustrating an area to be drawn when deflection by driving a mechanical moving objective lens and the objective deflector.

In this embodiment, as shown in FIG. 3C, the objective lens deflector 105, 106 is moved in a direction perpendicular to an optical axis 119 by use of the objective driving mechanism 114, for example, an actuator, voice coil, piezo actuator or the like for driving. In synchronism with the moving operation, the electron beam 118 is caused to pass along the optical axis of the objective lens deflector 105, 106 by use of the pre-objective lens deflector 110. The drawing process is effected by determining the shot position on the sample surface 107 by use of the objective lens deflector 105, 106 in this state. A reference numeral 203 in FIG. 3C is an area obtained by combining an area drawn by the objective deflector 105 and an area drawn by moving the objective deflection area by use of the objective driving mechanism 114.

The pre-objective lens deflector 110 is constructed by a two-stage electrostatic deflector, for example, and the electron beam deflected by the first-stage deflector is swung back by the second-stage deflector. As a result, the electron beam is shifted in parallel to the optical axis. Further, it is possible to use a piezoelectric element instead of the magnet to move the objective lens deflector 105, 106.

Figure 4:
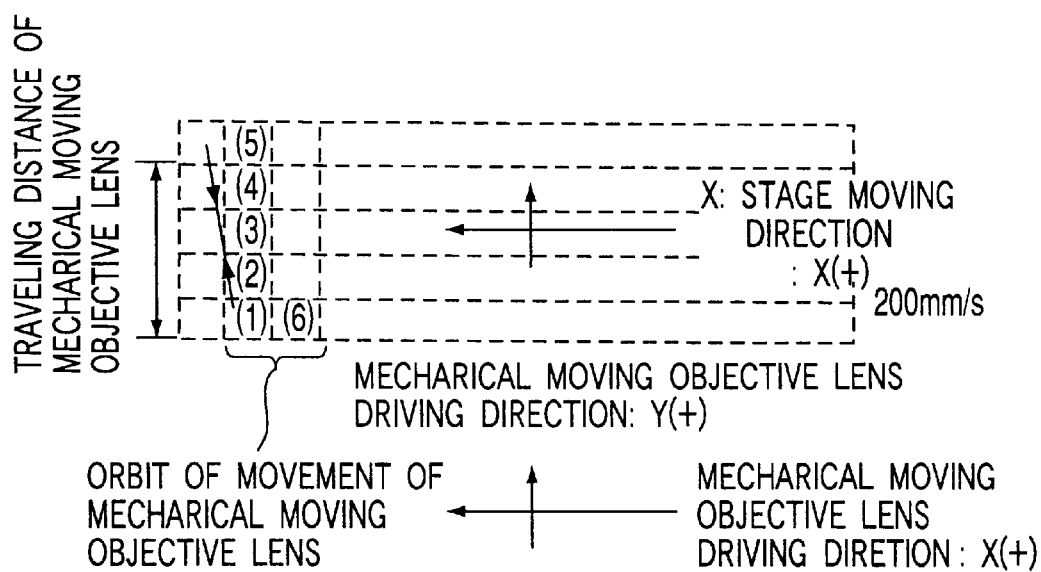
FIG. 4 is a simulated diagram for illustrating the drawing sequence in the first embodiment.
Figure 5:
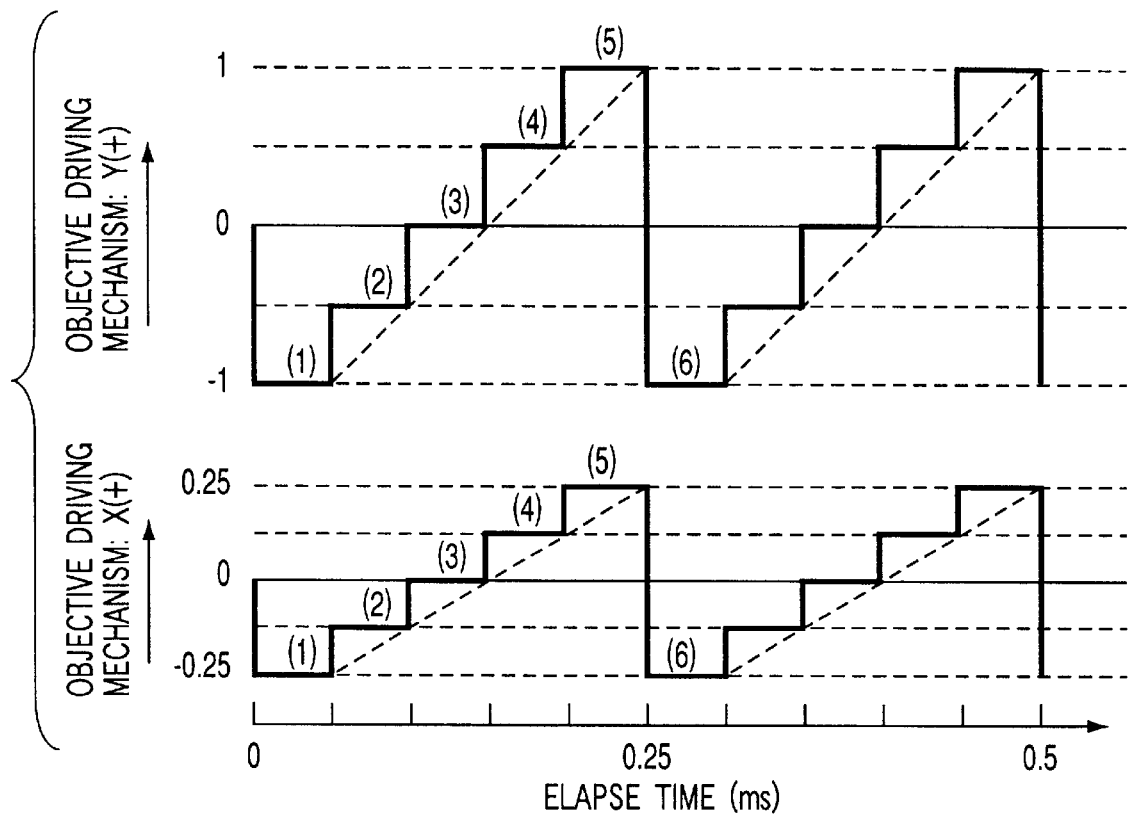
FIG. 5 is a simulated diagram for illustrating the drawing sequence in the first embodiment.

FIGS. 4 and 5 are diagrams schematically showing the drawing sequence of this embodiment. FIG. 4 shows the moving direction of the stage 117 and the orbit of the position of the objective lens deflector 105, 106 driven by the objective driving mechanism 114. Each square indicated by broken lines in FIG. 4 is an area drawn by the objective lens deflector 105, 106. First, the objective lens deflector 105, 106 is moved to the position (1) of FIG. 4 by the objective driving mechanism 114 to draw an internal portion of one square in this position by objective deflector. Then, the objective lens deflector 105, 106 is moved to the position (2) to draw an internal portion of the square. The same operation is repeatedly effected to draw internal portions of the squares (3), (4), (5) in this order. After the drawing for one column is completed, the objective lens deflector 105, 106 is moved to the position (6) and the above operation is sequentially repeated.

FIG. 5 schematically shows the positions of the objective driving mechanism 114 in the X and Y directions. In this case, the stage 117 is moved from the right side to the left side in FIG. 5. The Y direction of the objective driving mechanism corresponds to a direction perpendicular to the moving direction of the stage 117 and the X direction thereof corresponds to a moving direction of the stage 117. The objective driving mechanism 114 is moved in the X direction in order to correct the positional deviation due to the movement of the stage 117 in the X direction when the drawing is effected while the objective driving mechanism 114 is being moved in the Y direction. At this time, the positions of the stage 117 and the objective lens deflector 105, 106 are measured by the laser interferometer 108 and position information is fed back to the control computer 116 so as to correct the beam position on the sample surface based on the position information.

By repeatedly effecting the above operation, while the total deflection area is enlarged and the throughput is enhanced, the electrostatic deflection area by the objective lens deflector 105, 106 can be made small. As a result, the aberration and drawing precision can be enhanced.

Further, in this embodiment, the energy of the electron beam 118 incident on the sample 107 is set at 5 kV. If a low-acceleration electron beam is used for drawing, a so-called proximity effect can be neglected and a troublesome function for correcting an beam application amount can be omitted. Further, in this embodiment in which the sensitivity for exposure of the resist becomes high in substantially inverse proportion to the acceleration voltage, the optimum dose amount with respect to the electron beam having the energy of 5 kV is 0.2 $\mu C/cm^2$.

If the low-acceleration electron beam is used, the degree of blur of the beam by repulsion between electrons or so-called Coulomb interaction effect becomes large and the resolution is lowered. In order to suppress the Coulomb effect, repulsion time of electrons may be reduced, that is, a column length may be reduced.

Generally, lenses constructing the column include an electromagnetic lens and electrostatic lens. The electromagnetic lens requires an electronic coil and yoke and is difficult to be made small because of the structure and the column length cannot be reduced. On the other hand, the electrodes of the electrostatic lens can be made small, the electrostatic lens can be made small from the viewpoint of its structure and the column length can be reduced.

By using the electrostatic type objective lens deflector 105, 106, the lens can be formed with small and light construction. Then, the objective lens deflector 105, 106 can be driven at high speed by driving the light-weight objective lens deflector 105, 106 by use of an actuator, for example, a voice coil, piezo actuator or the like for driving and controlling.

Figure 6:
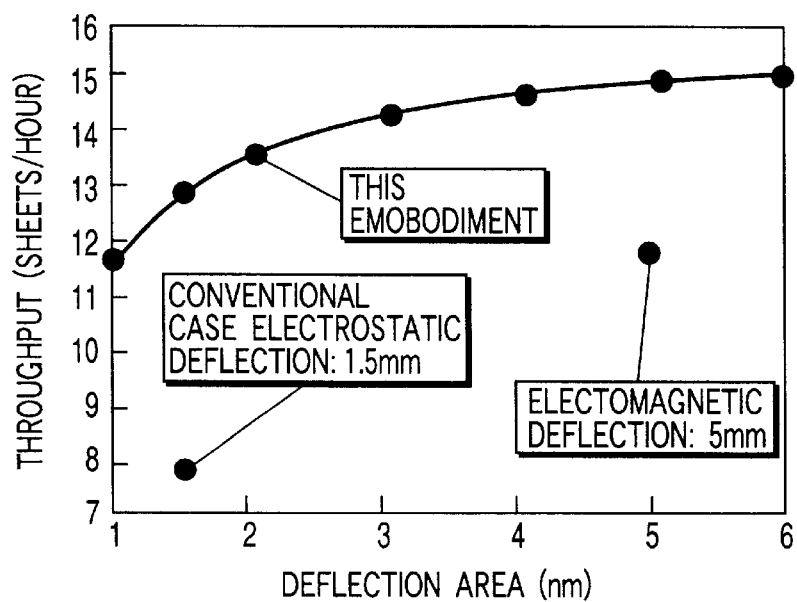
FIG. 6 is a characteristic diagram showing the evaluation of the throughput for two type of conventional drawing apparatus and the first embodiment.

FIG. 6 is a diagram showing the result of evaluation of the throughput of the drawing apparatus with the above construction.

In this embodiment, the condition is set such that the resist sensitivity is 0.2 $\mu C/cm^2$ and the current density is 5 $A/cm^2$ with the objective deflection area set at 1.5 mm (objective driving: ±0.5 mm, electrostatic deflection: 500 $\mu$m). The throughput at the time of 5 mm driving by the objective driving mechanism was 15 wafers/hour and the beam aberration at this time was 20 nm and the deflection distortion was 20 nm.

In the conventional case, the objective deflection area is set at 1.5 mm and the electrostatic deflection is effected for all of the deflection area of 1.5 mm without moving the objective lens deflector 105, 106. The condition is set such that the resist sensitivity at this time is 0.2 $\mu C/cm^2$ and the current density is 5 $A/cm^2$. The throughput at this time was 7.8 wafer/hour, the beam aberration was 150 nm and the deflection distortion was 200 nm.

The reason why the beam aberration and deflection distortion are made smaller in this embodiment than in the conventional case is that the deflection area by the electrostatic deflector is reduced from 1.5 mm to 500 $\mu$m. The throughput is enhanced by the following reason. In the case of an electrostatic deflector, time (settling time) from application of a set voltage until the deflection becomes stable is required to be relatively long and the settling time becomes longer with a higher deflection voltage. Therefore, in this embodiment in which the deflection voltage can be set low, the settling time can be reduced and the throughput can be enhanced. The objective driving process in this embodiment is a stepwise moving process and since the number of moving steps is small, substantially no problem occurs by an increase in the time for the objective driving.

Further, a high-acceleration electron beam drawing apparatus is used as a model for the electromagnetic deflection 5 mm in the conventional case. The condition is set such that the resist sensitivity at this time is 2 $\mu C/cm^2$ and the current density is 10 $A/cm^2$. The throughput at this time was 11.8 wafer/hour.

As is clearly understood from the above description, in this embodiment, the throughput can be approximately doubled and the beam aberration and deflection distortion can be reduced to approximately 1/10 times the conventional case in which the resist sensitivity and current density are set in the same condition as in this embodiment.

Further, in this embodiment, the electrostatic lens is used as the objective lens, but the condenser lens 102, projection lens 124 and reduction lens 126 of FIG. 1 may be constructed by an electrostatic lens.

If, for example, an actuator driven and controlled by magnetic force of a magnet is used as the objective driving mechanism 114 shown in FIG. 1, leakage magnetic flux is generated from the actuator when the position of the objective lens 106 containing the objective deflector 105 is moved in a direction perpendicular to the optical axis 119. Therefore, in order to prevent the leakage flux from giving an influence on the electron beam 118, a magnetic cover is mounted to surround the actuator so as to eliminate the influence by the leakage flux on the electron beam 118. Alternatively, although not shown in the drawing, a magnetic field which cancels the magnetic field generated by the actuator is generated so as to eliminate the influence on the electron beam 118. Further, a signal for controlling the objective driving mechanism may be a sawtooth waveform, but a sinusoidal waveform may be used as the signal without causing any problem since the electron beam is deflected at high speed.

Thus, this embodiment is related to the construction of the objective lens of the electron beam drawing apparatus, the driving mechanism which permits the objective lens containing the objective deflector to be mechanically moved in a direction perpendicular to the optical axis is used, the large deflection is attained by mechanical movement, and each shot in the deflection area is drawn by use of the electrostatic deflection. By using the above construction, it becomes possible to enhance the drawing precision without degrading the throughput.

(Second Embodiment)

Figure 7:
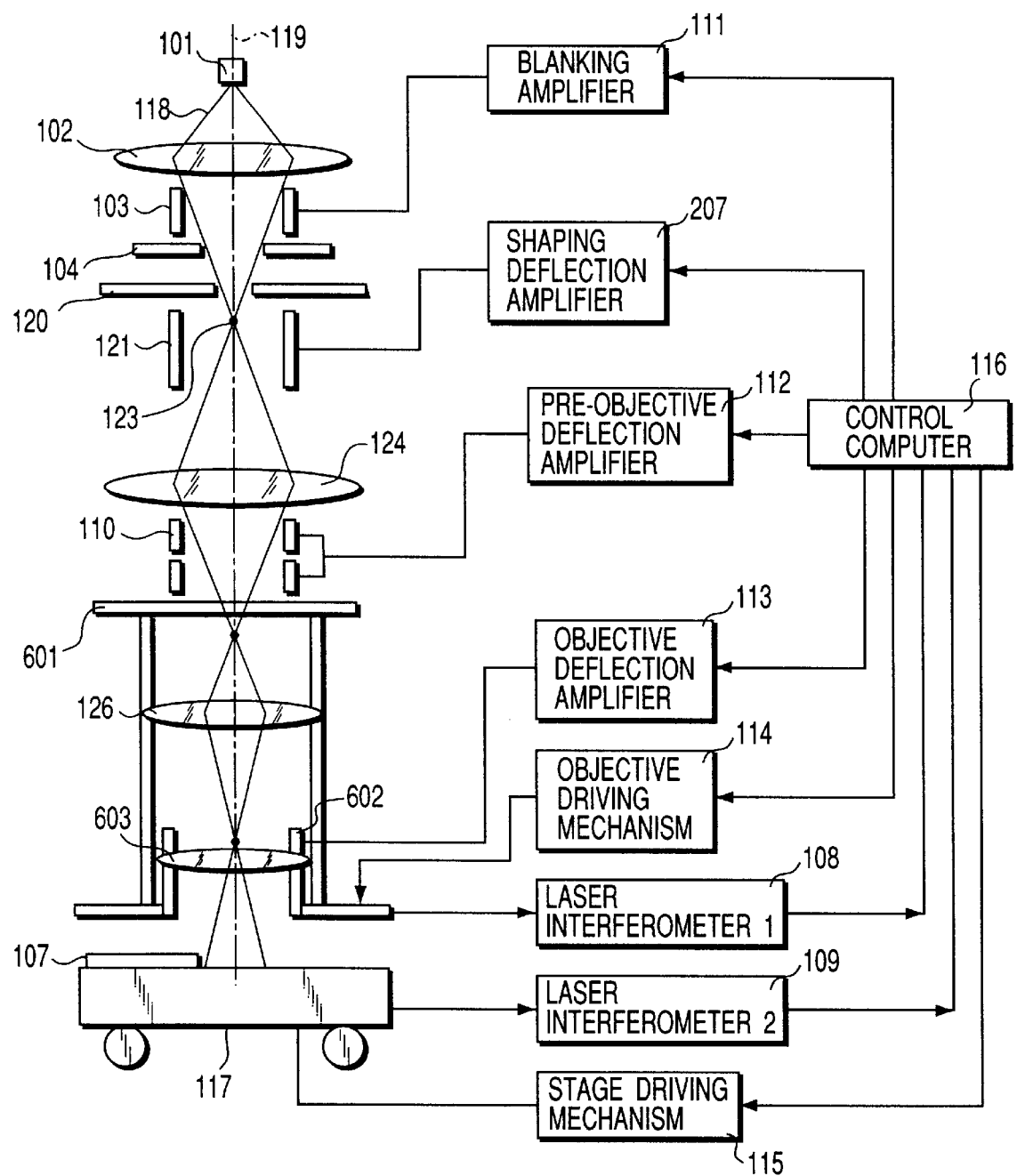
FIG. 7 is a schematic construction view showing an electron beam drawing apparatus according to a second embodiment of this invention.

FIG. 7 is a schematic construction view showing an electron beam drawing apparatus according to a second embodiment of this invention. Portions which are the same as those of FIG. 1 are denoted by the same reference numerals as in FIG. 1 and the detail explanation therefor is omitted.

This embodiment is an example in which this invention is applied to an electron beam drawing apparatus of character beam drawing system and has a feature that the throughput is high in comparison with the drawing apparatus of beam dimension fixing system or variably forming type beam system.

Figure 8:
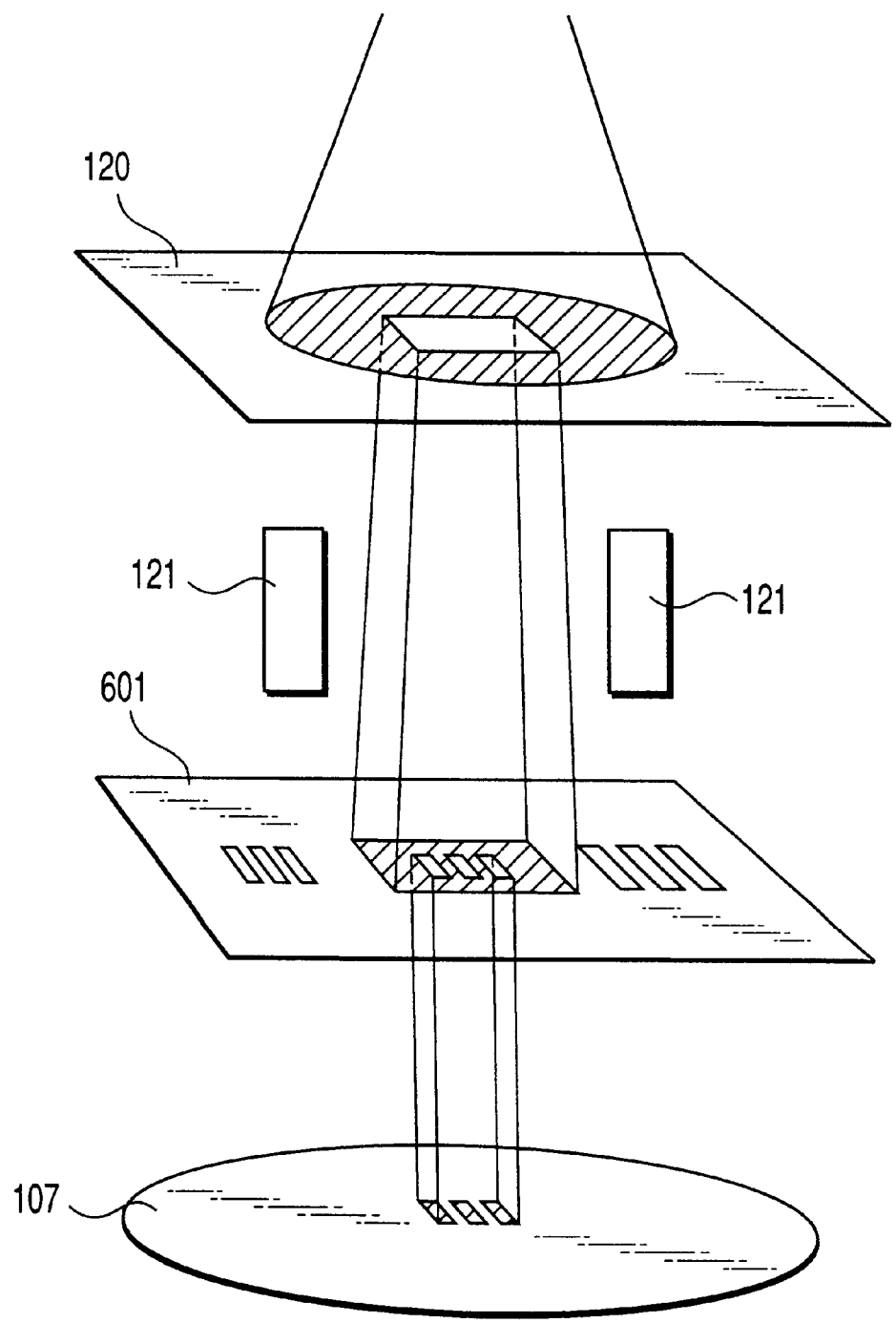
FIG. 8 is a showing the construction of an optical system for illustrating a character projection drawing system.

In the drawing apparatus of this system, as shown in FIG. 8, an electron beam passing through a first forming aperture mask 120 is illuminated on a character mask 601 and formed into a desired shape by the character mask 601, and then the character beam is focused on the main surface of a sample 107. The position of the character beam is changed by the objective deflector to draw a repeated pattern at high speed. With this system, the extremely high throughput can be attained in a case where a beam shape to be drawn is frequently repeated as in the drawing of DRAM.

The contents of this embodiment are explained in detail below. As shown in FIG. 7, the current density of an electron beam 118 emitted from an electron gun 101 is adjusted by a condenser lens 102 and the electron beam is uniformly applied to the first shaping aperture mask 120. The electron beam 118 passing through the first shaping aperture mask 120 is illuminated on the character mask 601. The position of the electron beam on the character mask 601 is controlled by a shaping deflector 121. The shaping deflector 121 is controlled by a shaping deflection amplifier 127 and control computer 116.

The electron beam 118 formed by the character mask 601 is reduced by a reduction lens 126 and is focused on the sample 107 by objective lens 603. The position of the electron beam 118 on the sample surface is controlled by an objective deflector 602 which is applied with a deflection voltage by an objective deflection amplifier 113.

In this embodiment, not only the objective lens 603 and objective deflector 602 but also the character mask 601 and reduction lens 126 can be integrally moved by an objective driving mechanism 114. Like the first embodiment, a pre-objective lens deflector 110 for shifting the axis of the electron beam to the optical axis is arranged on the electron gun side of the character mask 601.

In the apparatus thus constructed, the structure containing the objective deflector 602, objective lens 603, reduction lens 126 and character mask 601 is moved in a direction perpendicular to the optical axis 119 by use of the objective driving mechanism 114. In synchronism with the movement of the structure, the electron beam 118 is applied to the desired character mask 601 by the pre-objective lens deflector 110 arranged between the first shaping aperture mask 120 and the character mask 601. Then, the drawing is effected by determining a shot position on the sample surface 107 by the objective deflector 602 by use of the electron beam 118 formed by the character mask 601. Position information of a stage 117 on which the sample 107 is placed or the objective lens 603 and objective deflector 602 is measured by use of first and second laser interferometers 108 and 109 and is fed back to the control computer 116.

By repeatedly effecting the above operation, the electrical deflection area by the objective deflector 602 itself can be made small while the total deflection area is enlarged and the throughput is enhanced, and as a result, the aberration and drawing precision can be enhanced. Further, since the pre-objective lens deflector 110 which deflects the electron beam 118 in connection with the objective driving mechanism 114 is arranged nearer to the electron gun 101 side than the character mask 601, the deflection aberration by the pre-objective lens deflector 110 gives no influence on the electron beam 118 on the sample surface 107. Thus, the character beam with less aberration and distortion can be attained.

Further, as is described in the first embodiment, in this embodiment, the condenser lens 102, projection lens 124, reduction lens 126 and objective lens 603 of FIG. 7 may be constructed by an electrostatic lens. In addition, as shown in FIG. 1, the objective lens portion can be constructed by an objective lens deflector in which the objective lens 105 and the objective deflector 106 are formed of one electrode.

If, for example, an actuator driven and controlled by magnetic force of a magnet is used as the objective driving mechanism 114 shown in FIG. 7, a magnetic shield cover is mounted to surround the actuator to eliminate the influence by the leakage flux on the electron beam 118 so that the leakage flux can be prevented from giving an influence on the electron beam 118. Alternatively, although not shown in the drawing, a magnetic field which cancels the magnetic field generated by the actuator is generated so as to eliminate the influence on the electron beam 118. Further, a signal for controlling the objective driving mechanism may be a sawtooth waveform, but a sinusoidal waveform may be used as the signal without causing any problem since the deflecting operation is effected at high speed.

Thus, this embodiment is related to the construction of the objective lens of the electron beam drawing apparatus and the driving mechanism for mechanically moving the structure containing the objective deflector 602, objective lens 603, reduction lens 126 and character mask 601 in a direction perpendicular to the optical axis 119 is provided. Further, the electron beam 118 is applied to the desired character mask 601 by the pre-objective lens deflector 110 arranged between the projection lens 124 and the character mask 601. The large deflection is attained by mechanical movement and each shot in the deflection area is drawn by use of the electrostatic deflection. By using the above construction, it becomes possible to enhance the drawing precision without degrading the throughput.

(Third Embodiment)

Figure 9:
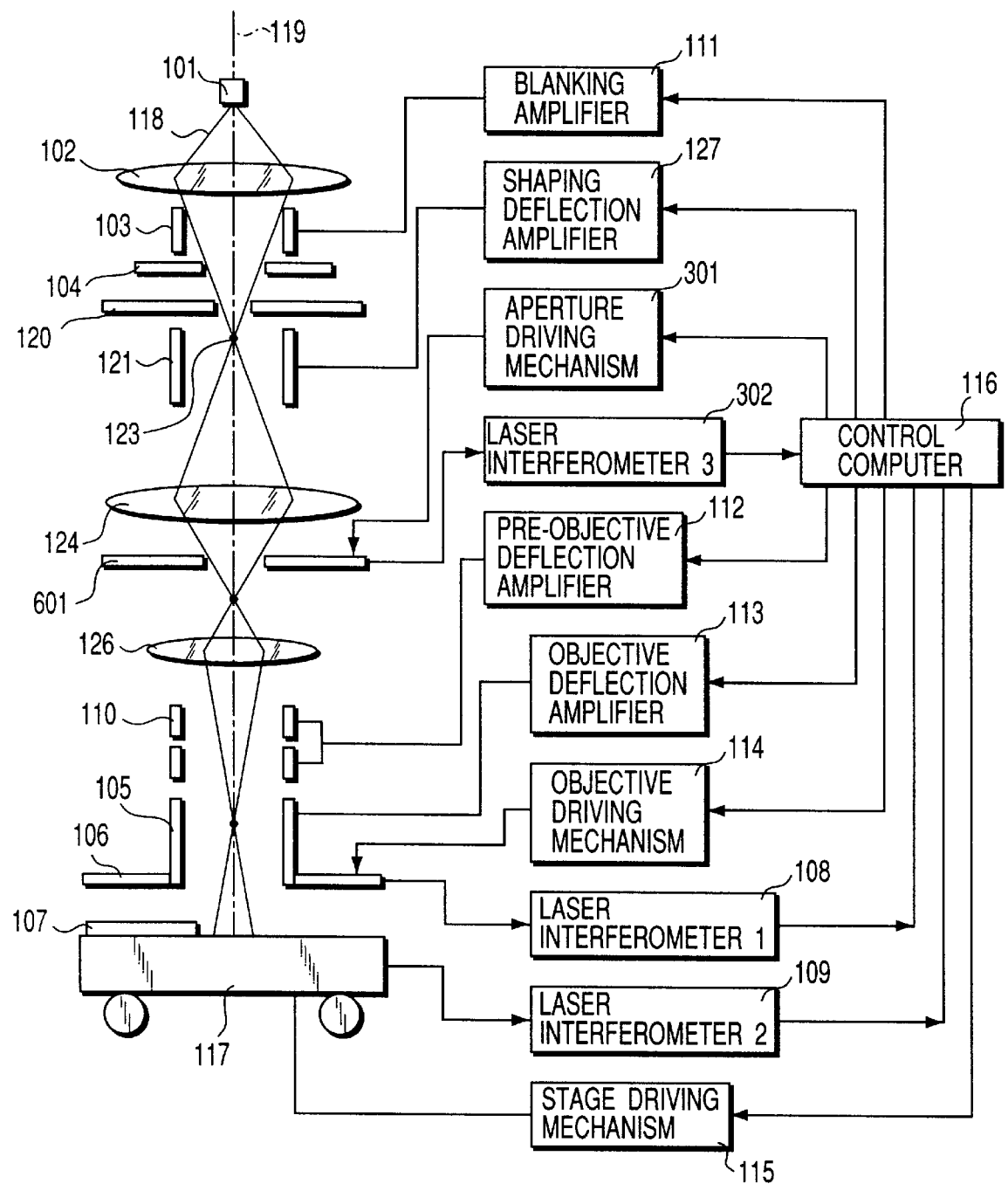
FIG. 9 is a schematic construction view showing an electron beam drawing apparatus according to a third embodiment of this invention.
Figure 10:
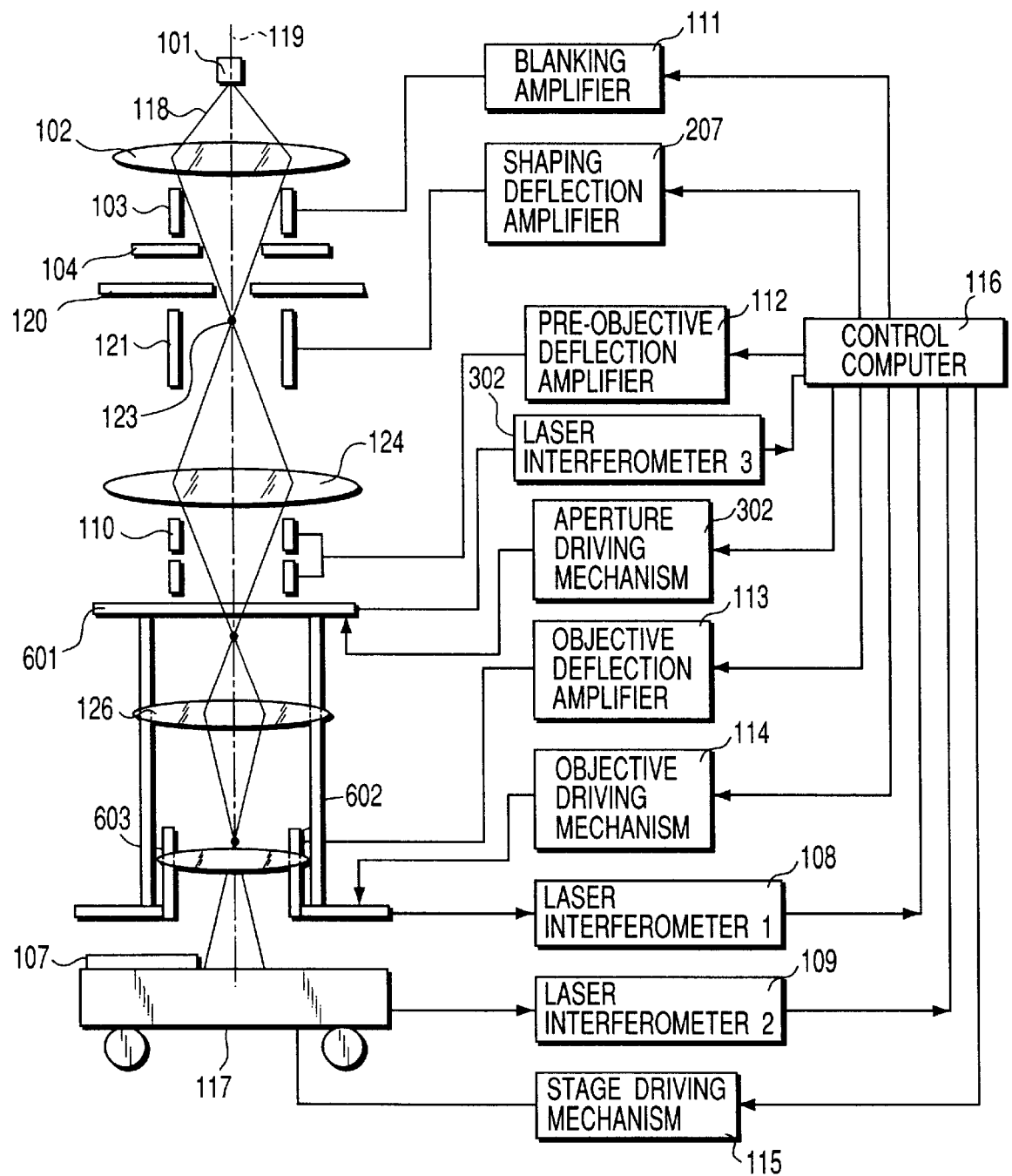
FIG. 10 is a schematic construction view showing an electron beam drawing apparatus according to the third embodiment of this invention.

FIGS. 9 and 10 are schematic construction views showing an electron beam drawing apparatus according to a third embodiment of this invention. Portions which are the same as those of FIGS. 1 and 7 are denoted by the same reference numerals as in FIGS. 1 and 7 and the detail explanation therefor is omitted.

This embodiment is different from the second embodiment in that the character mask 601 in the second embodiment can be mechanically moved. That is, in FIG. 9, the character mask 601 can be moved in X and Y directions in a plane perpendicular to the axis along which the beam passes by use of a mask driving mechanism 301 and the movement position thereof is measured by a laser interferometer 302. In FIG. 10, the character mask 601 can be moved in the X and Y directions independently from the reduction lens 126, objective deflector 602 and objective lens 603 by use of the mask driving mechanism 301 and the movement position thereof is measured by the laser interferometer 302.

The character mask 601 is formed by making the central portion of the silicon wafer thin in a stencil form and forming an opening pattern (aperture) therein. The normal size thereof is approx. 10 mm and an opening pattern is arranged in the deflection area (normally, 1 to 2 mm☐) of the deflector in the central portion thereof. However, since the size (smaller than the deflection area of the deflector) of the opening pattern is limited, patterns of a number required for formation of the device pattern cannot be formed in one mask. Therefore, the mask of 10 mm☐ is dealt with as the minimum unit and a mask group containing a plurality of above masks is mechanically moved in the X-Y plane perpendicular to the beam passing axis by the mask driving mechanism 301 so as to permit all of the apertures required for formation of the device pattern to be selected.

The deflection area of the objective deflector 105, 602 is determined by the restriction (aberration, distortion and the like) on the design of the electronic optical system. The throughput can be enhanced by enlarging the area, but the aberration is increased to make it difficult to attain the high-precision drawing. In this respect, like the first and second embodiments, the position of the objective deflector 105, 602 is moved in a direction perpendicular to the optical axis 119 by the objective driving mechanism 114. In synchronism with the movement thereof, the electron beam is set to pass along the optical axis of the objective deflector 105, 602 by use of the pre-objective lens deflector 110 and the shot position on the sample surface 107 is determined by the objective deflector 105, 602 to effect the drawing.

Thus, according to this embodiment, since the number of apertures in the character mask 601 is not limited, all of the device patterns can be expressed in a character form. As a result, the device pattern can be drawn with the maximum beam size without drawing the pattern (because it becomes unnecessary to effect the VSB drawing) while the beam size is being changed. Thus, the throughput can be extremely enhanced in comparison with the electron beam drawing apparatus which also utilizes the conventional VSB drawing.

Figure 11:
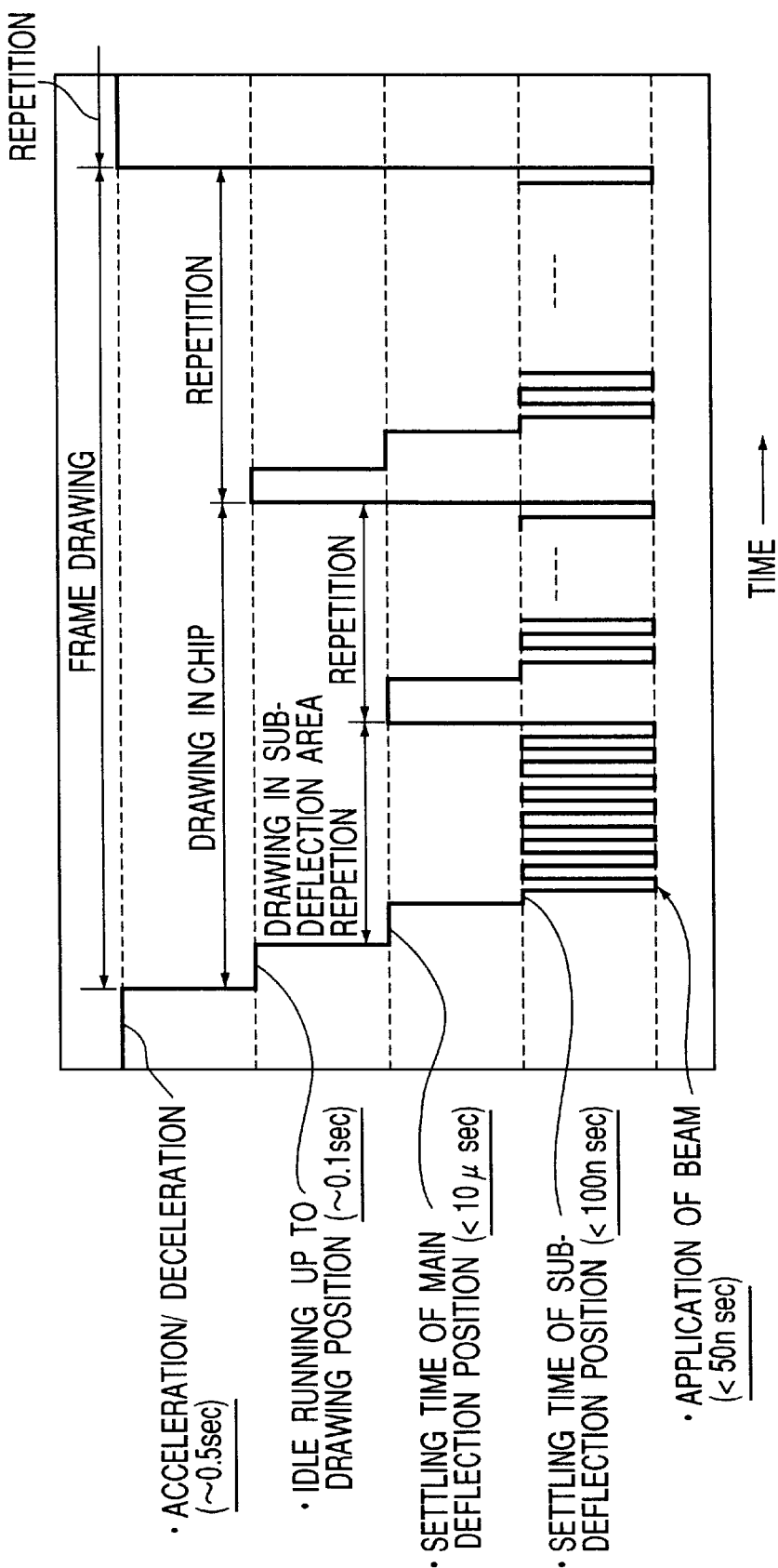
FIG. 11 is a simulated diagram showing the driving timing of the aperture driving mechanism in the drawing sequence.

FIG. 11 is a diagram showing the driving timing of the mask driving mechanism of the electron beam drawing apparatus in the drawing sequence. If the character mask is mechanically driven, time of several ten milliseconds to several hundred milliseconds is taken from the start of driving to the stop (until the position stability of the mask falls into a permissible range). As is clearly seen from the driving sequence, since time which can be reduced or omitted (without lowering the throughput) lies only in acceleration and deceleration time of the stage 117 in a period other than the beam application time, the apertures 125, 601 are moved at the turn-back time of the stage. By this movement, the mask group can be selected without lowering the throughput.

Figure 12A:
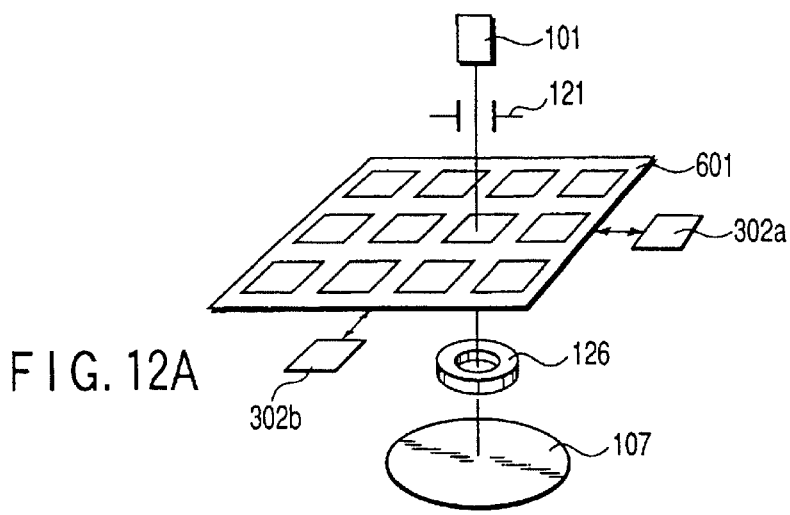
FIG. 12A is a simulated view showing the construction of an optical system containing a mask.
Figure 12C:
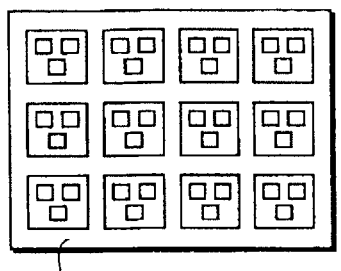
FIG. 12C is a simulated view showing an example of the pattern arrangement in the aperture group.
Figure 12C:
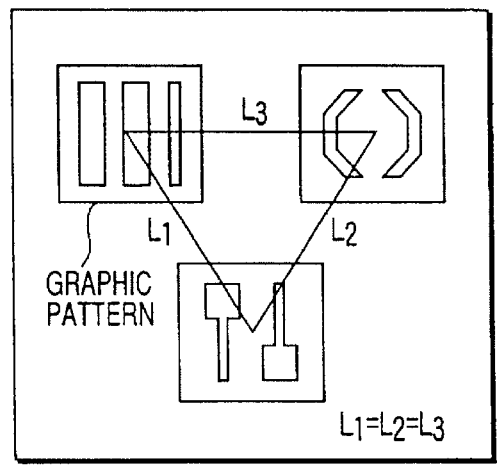

FIGS. 12A to 12C show the arrangement of the graphic pattern of a mask used as the minimum unit of a character mask driven in the apparatus shown in FIG. 9. FIG. 12A shows the structure of an optical system containing the character mask 601, FIG. 12B shows the aperture group formed in the character mask 601, and FIG. 12C shows an example of the pattern arrangement in each aperture of the aperture group.

The laser interferometer 302 has two interferometer units arranged in the X direction (302a) and in the Y direction (302b). For example, three graphic patterns are arranged in each aperture of the aperture group constructing the character mask 601. In this case, the distance between the centers of the three graphic patterns is set equal to one another (L1=L2=L3).

The deflector is used to select the graphic pattern in the aperture dealt with as the minimum unit in the aperture group, but if the distance between the patterns is different when the pattern is selected, time for switching selection of the pattern becomes different. Therefore, the three graphic patterns are prepared, the distance between the patterns is made equal to one another to set the pattern selection switching time to the same minimum time so that the graphic pattern in the aperture group can be selected without lowering the throughput.

Thus, in this embodiment, the same effect as that of the first and second embodiments can be attained by providing the pre-objective lens deflector 110 and objective driving mechanism 114 and the drawing throughput can be further enhanced by providing the mask driving mechanism 301 for mechanically driving the character mask 601 and the like.

(Fourth Embodiment)

In this embodiment, the driving by the driving mechanism such as the objective deflector and the objective lens is attained by use of a sinusoidal wave and the driving position is corrected by the deflector. Before explaining this embodiment, the drawing method when the driving mechanism is used is explained.

Figure 13A:
FIGS. 13A–13C are simulated diagrams showing an example of the drawing area in the drawing method of MMOL (Mechanical Moving Objective lens)
Figure 13B:
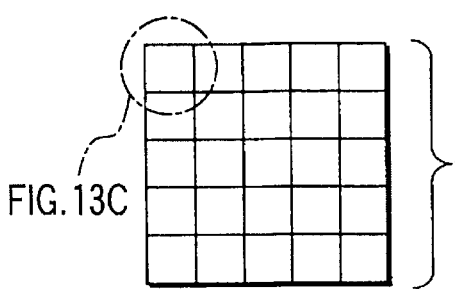
Figure 13C:
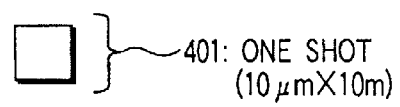

The operation for moving the position of the objective lens 106 in a direction perpendicular to the optical axis 119 by use of the drawing apparatus as described in the first embodiment shown in FIG. 1 is referred to as MMOL (Mechanical Moving Objective Lens). FIGS. 13A–13C are diagrams for illustrating the MMOL drawing method.

One shot 401 of an electron beam formed by a second shaping aperture mask 125 is drawn on a sub-deflection area 402 (in this example, 50 μm☐, 25 shots) by sub-deflection for deflecting the electron beam at high speed by use of a relatively low voltage. The internal portion of the sub-deflection area 402 is covered by large deflection by the main deflection and a wide area, in this example, one main deflection line 403 of 500 μm is drawn on the wafer. In this case, the objective deflector 105 of the drawing apparatus shown in FIG. 1 is constructed by the two-stage deflector of main deflector unit and sub-deflector unit and the main deflection and sub-deflection are effected by use of the objective deflector 105.

Figure 14A:
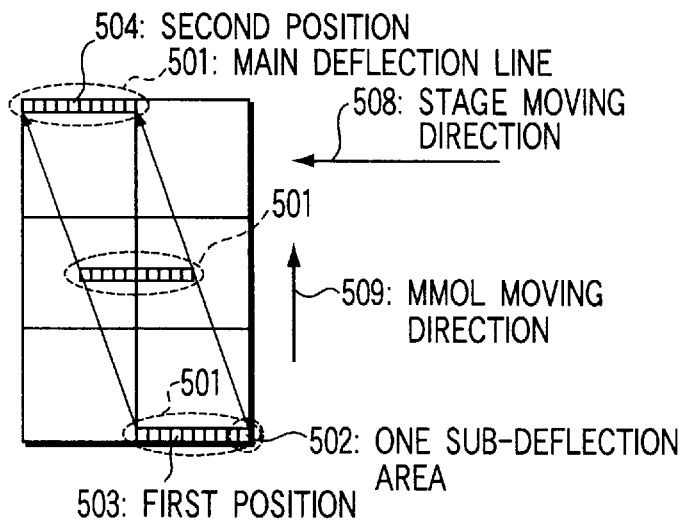
FIG. 14A is a simulated diagram showing the state of drawing from a first position to a second position in the drawing method of MMOL.

FIGS. 14A to 14D are diagrams for illustrating the MMOL driving method and indicate an area drawn on the wafer. First, as shown in FIG. 14A, the electron beam is set on a first position 503, one sub-deflection area 502 is sequentially drawn by use of electrostatic main deflection and a main deflection line 501 is drawn. At this time, MMOL is driven in a moving direction 509 and the main deflection line 501 is sequentially drawn on the wafer. A stage moving direction 508 is perpendicular to the moving direction 509 and the stage is moved at a constant speed.

In this case, the electrostatic main deflection deflects the electron beam only in the stage moving direction 508 and the main deflection line 501 is drawn in this state. At this time, MMOL is moved in the upward direction 509, and at the same time, the stage speed is adequately set so that the stage can be moved by the same distance as the traveling distance of one main deflection line 501 in the stage moving direction 508 for the drawing time of one MMOL column.

The relation thereof can be expressed by the following equations (1) to (5).

$$\text{Shot Time (sec) } T\exp = D/J \tag{1}$$

$$\text{One Sub-Deflection Exposure Time (sec) } T\text{sub} = n\text{sub} \times (T\exp + t\text{sub}) \tag{2}$$

$$\text{One Main Deflection Column Exposure Time (sec) } T\text{main} = n\text{main} \times (T\text{sub} \times t\text{main}) \tag{3}$$

$$\text{MMOL Frequency (Hz) } T\text{mol} = l\text{mmol}/l\text{sub} \times T\text{main} \times 2 \tag{4}$$

$$\text{Stage Speed (m/s) } Ss = l\text{main}/T\text{main} \tag{5}$$

where D is a dosage ($\mu$C/cm$^2$), J is a current density (A/cm$^2$), tsub is sub-deflection settling time (sec), tmain is main deflection settling time (sec), nsub is the number of shots in the sub-deflection area, lmmol is an MMOL deflection distance, nmain is the number of main deflections in one main deflection line and lsub is a sub-deflection field size.

For example, in the case of FIGS. 13A–13C, the drawing time for the internal portion in the sub-deflection area becomes (100 ns+100 ns)×25=5 $\mu$s when exposure time is set to 100 ns and the setting time of electrostatic sub-deflection is set to 100 ns. Further, when the MMOL deflection distance is set to 1.5 mm, 300 sub-deflection areas are present in one MMOL column. If the deflection setting time for electrostatic main deflection is 10 $\mu$s, time of (5 $\mu$s+10 $\mu$s)×300=4.5 ms is required for drawing one MMOL column. At this time, the optimum stage speed becomes 500 $\mu$m÷4.5 ms=111 mm/s if the size of the main deflection line is set to 500 $\mu$m. Further, one period of MMOL at this time may be set to 9 ms.

Figure 14B:
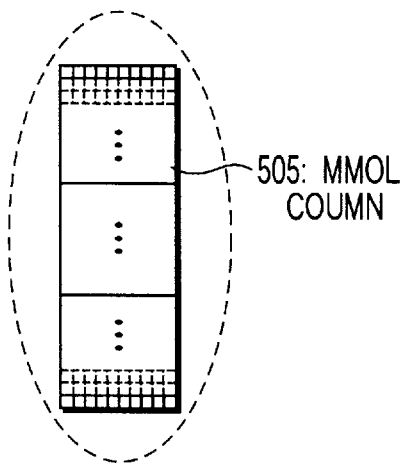
FIG. 14B is a simulated diagram showing the drawing state in which the drawing process up to the second position is completed in the drawing method of MMOL.

Thus, as shown in FIG. 14B, the drawing of one MMOL column 505 is completed by moving MMOL from a first position 503 to a second position 504 by controlling the MMOL, electrostatic main deflection and stage.

Figure 14C:
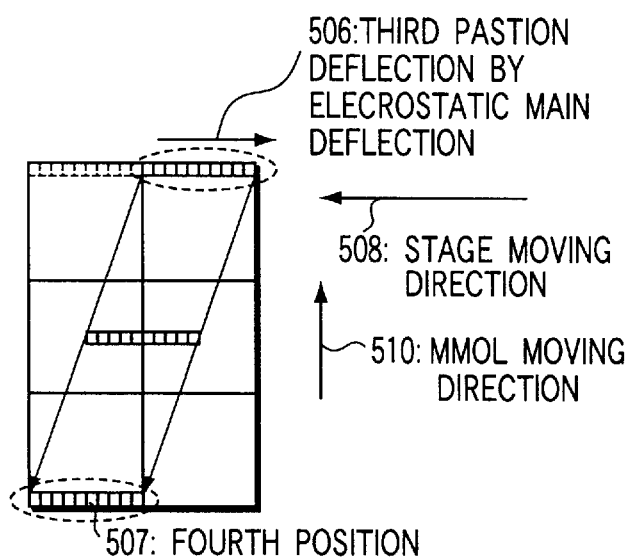
FIG. 14C is a simulated diagram showing the state of drawing from a third position to a fourth position in the drawing method of MMOL.
Figure 14D:
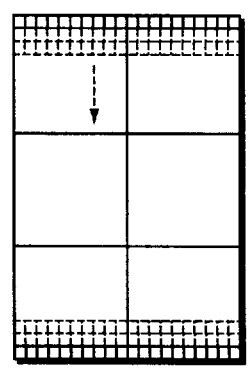
FIG. 14D is a simulated diagram showing the drawing state in which the drawing process up to the fourth position is completed in the drawing method of MMOL.

After the drawing up to the second position 504 is effected and the drawing of one MMOL column 505 is completed, the position of the beam on the wafer is deflected by the electrostatic main deflection to the third position 506 as shown in FIG. 14C. After this, when MMOL is moved from a third position 506 to a fourth position 507, two MMOL columns are drawn as shown in FIG. 14D. The same operation is sequentially effected to attain the drawing on the wafer.

Figure 15A:
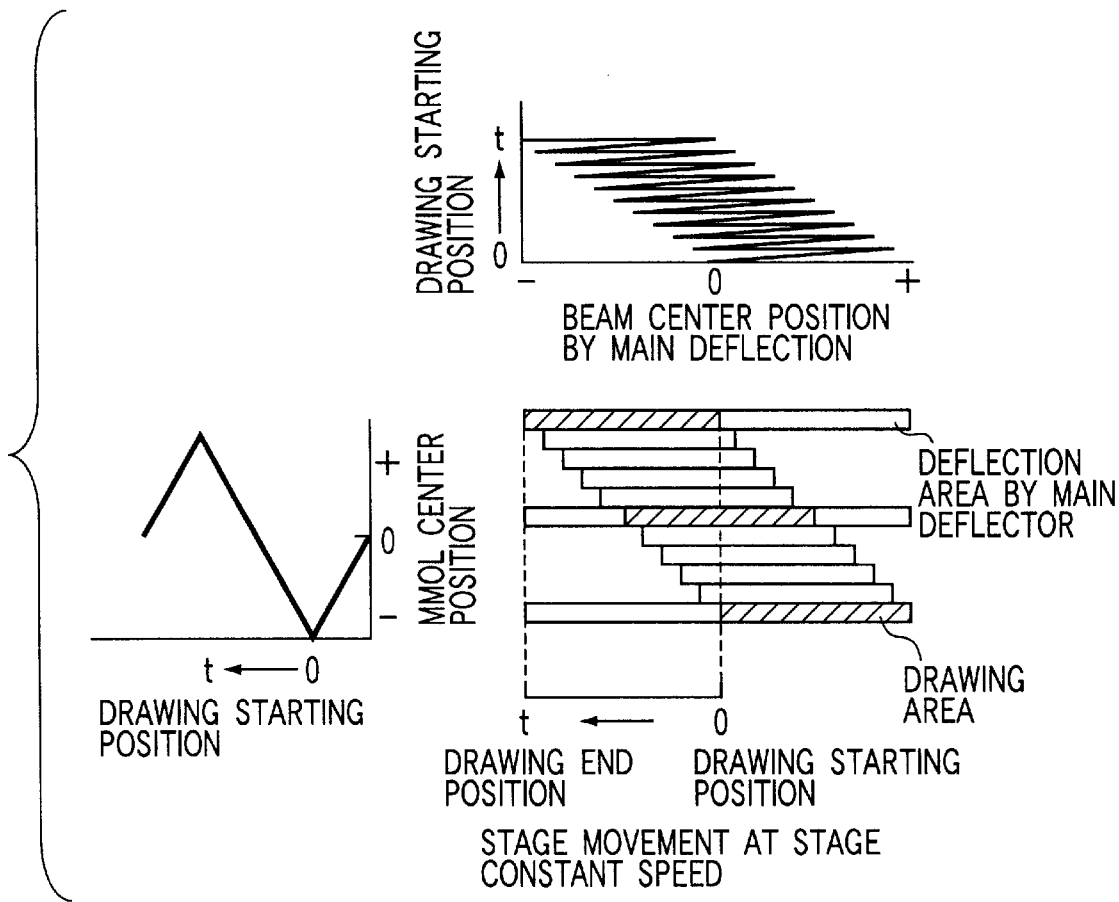
FIG. 15A is a simulated diagram for illustrating a problem in the drawing method of MMOL.
Figure 15B:
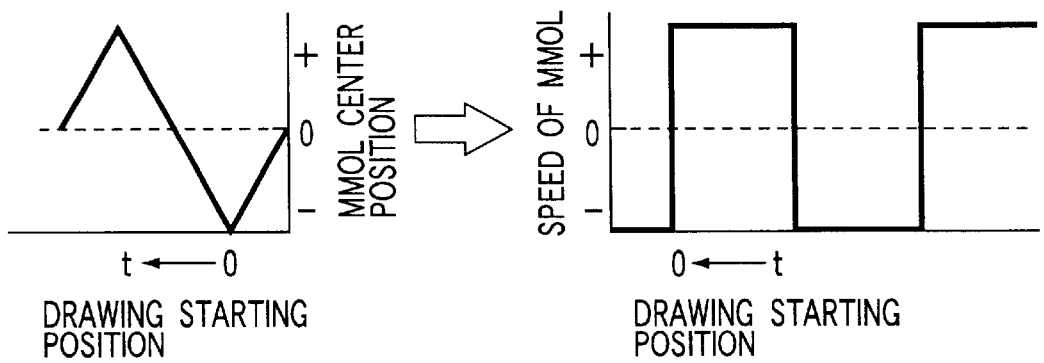
FIG. 15B is a simulated diagram for illustrating a problem in the drawing method of MMOL.

However, in the above MMOL driving method, a variation in the MMOL position is made in a sawtooth wave form as shown in FIG. 15A, and the MMOL speed is changed in a rectangular form as shown in FIG. 15B. Therefore, the variation in the MMOL speed becomes large at the switching time of the MMOL traveling direction, it is required to effect the control operation with a higher driving frequency for mechanical driving and the control operation becomes extremely difficult. More specifically, it is necessary to instantaneously move an object which is moved in a preset direction at a constant speed in an opposite direction at a constant speed and the control operation is practically difficult.

Figures 16A, 16B:
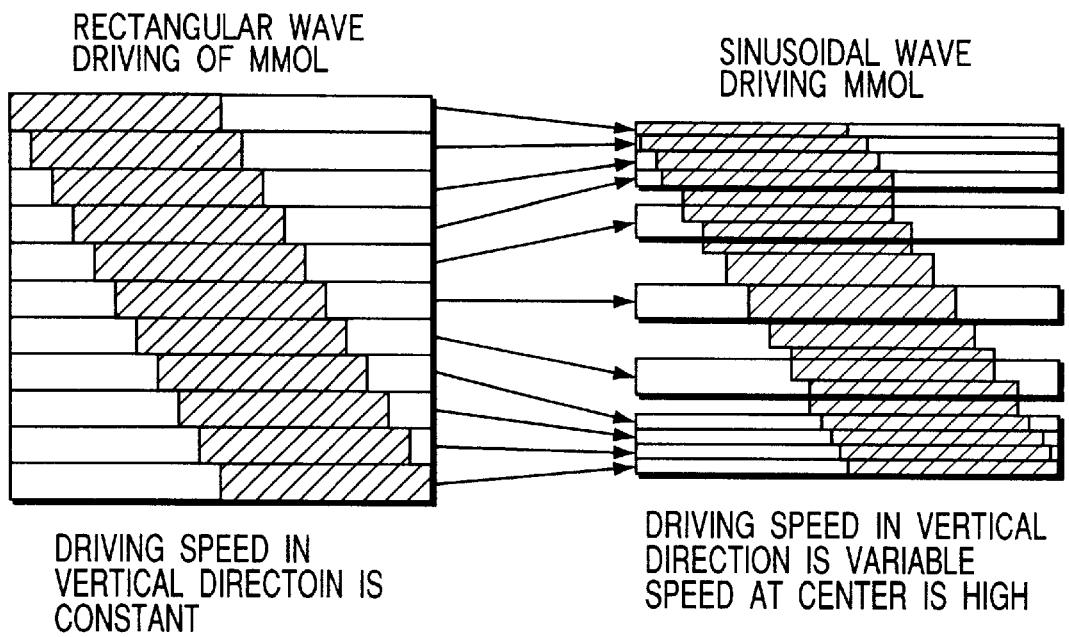
FIG. 16A is a simulated diagram showing the drawing state in the case of rectangular wave control of MMOL.
FIG. 16B is a simulated diagram showing the drawing state in the case of sinusoidal wave control of MMOL.

For driving and controlling MMOL at high speed, it is ideal to use a sinusoidal wave as the driving wave. When the MMOL moving waveform is a rectangular waveform, the MMOL moving speed is constant and the uniform drawing as shown in FIG. 16A can be attained. However, if the sinusoidal waveform is used as the MMOL driving waveform, the moving speed becomes high in the central portion of MMOL column, the moving speed becomes lower in a portion nearer to the periphery thereof, and as shown in FIG. 16B, the uniform drawing cannot be attained.

Figure 17A:
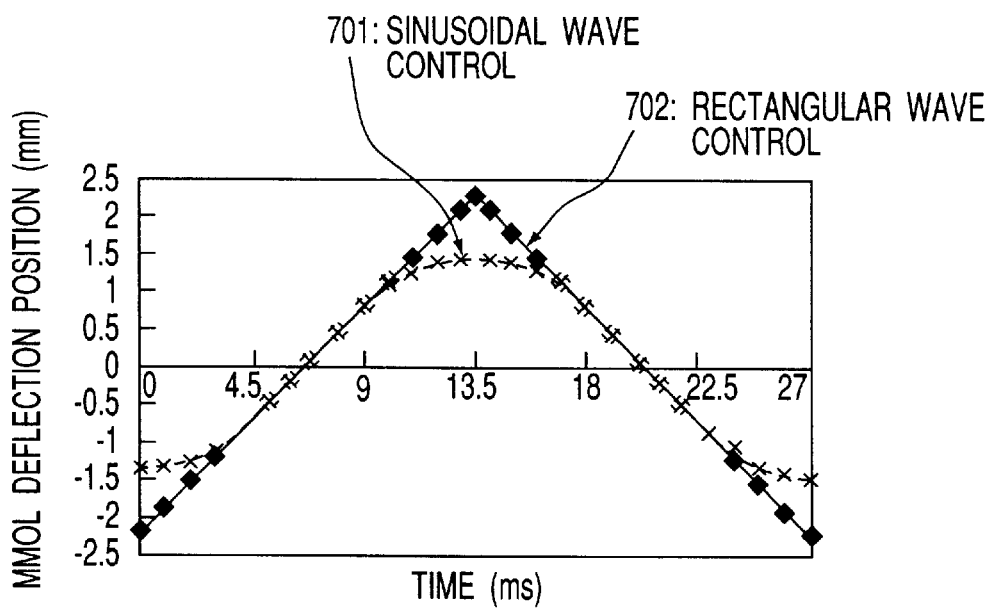
FIG. 17A is a diagram showing a variation in the MMOL deflection position in the MMOL rectangular wave driving and sinusoidal wave driving operations.
Figure 17B:
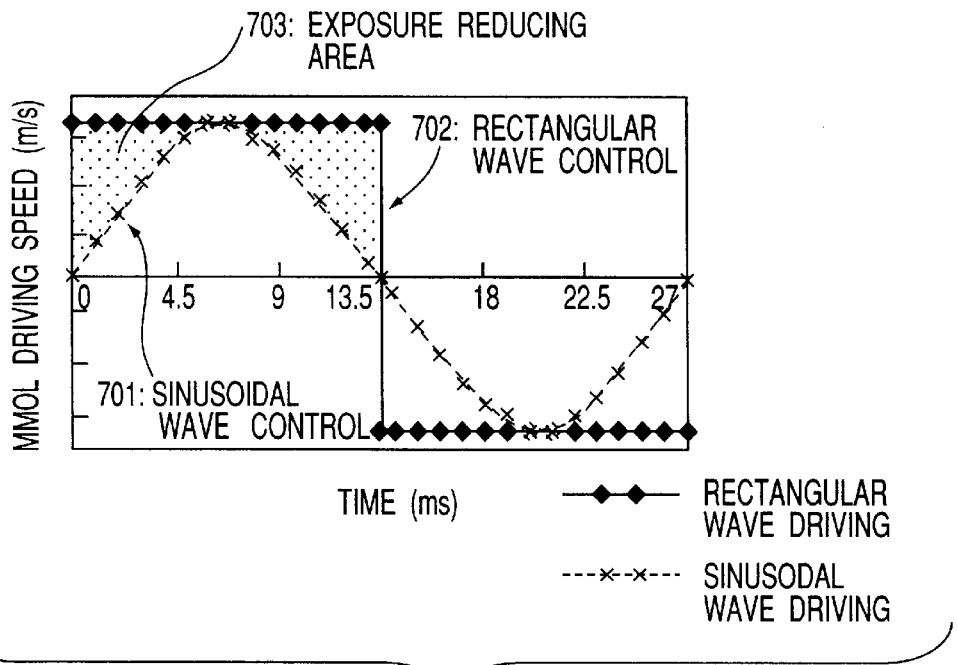
FIG. 17B is a diagram showing a variation in the MMOL driving speed in the MMOL rectangular wave driving and sinusoidal wave driving operations.

Variations in the deflection positions of MMOL in the rectangular wave driving operation and sinusoidal wave driving operation are as shown in FIG. 17A and variations in the MMOL driving speeds are as shown in FIG. 17B. As shown in FIGS. 17A, 17B, since the drawing area is an integrated value of the speed with the time, the drawing can be made only in an area of 67% in the case of the operation by sinusoidal wave control 701 in comparison with a case of the operation by rectangular wave control 702 (a reference numeral 703 in FIG. 17B indicates a drawing reduction area). For this reason, the drawing throughput in the operation by the sinusoidal wave control 701 is reduced to ⅔ times that in the case of the operation by the rectangular wave control 702.

This embodiment has a feature that the driving operation for mechanically moving the objective lens containing the objective deflector is effected by use of a sinusoidal wave and an electrical deflector is used for compensation so as not to lower the throughput. The drawing apparatus shown in FIG. 1 is used as the drawing apparatus. However, in order to prevent a lowering in the throughput due to a reduction in the drawing area by the MMOL driving by use of the sinusoidal wave, the MMOL driving and electrostatic main deflection are combined in a hybrid form to compensate for a reduction in the deflection area by the sinusoidal wave driving by use of the electrostatic deflection.

Figure 18A:
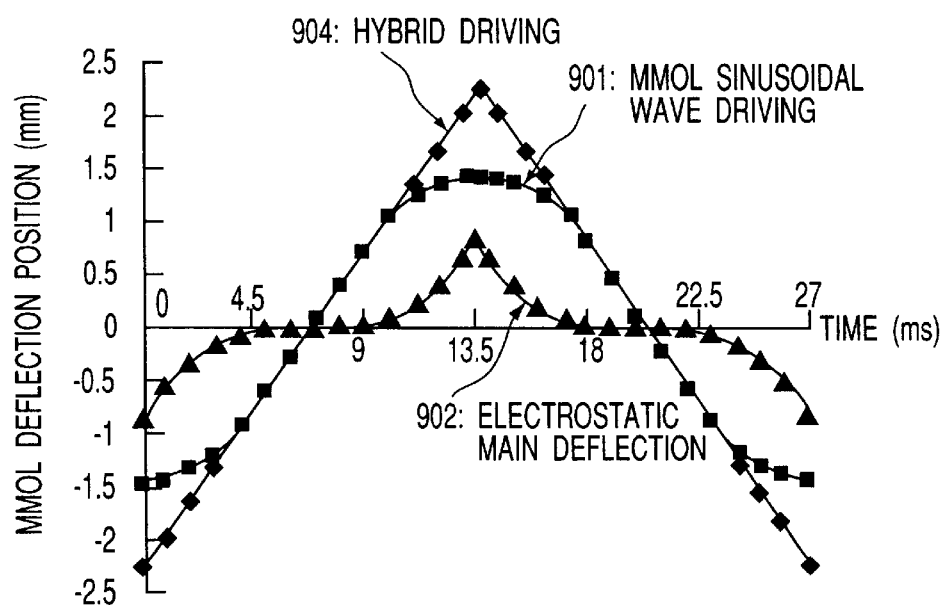
FIG. 18A is a simulated diagram showing a variation in the MMOL deflection position in the MMOL sinusoidal wave driving operation and electrostatic main deflection operation and in the hybrid deflection operation obtained by combining the above operations, for illustrating the MMOL sinusoidal wave driving operation according to a fourth embodiment of this invention.
Figure 18B:
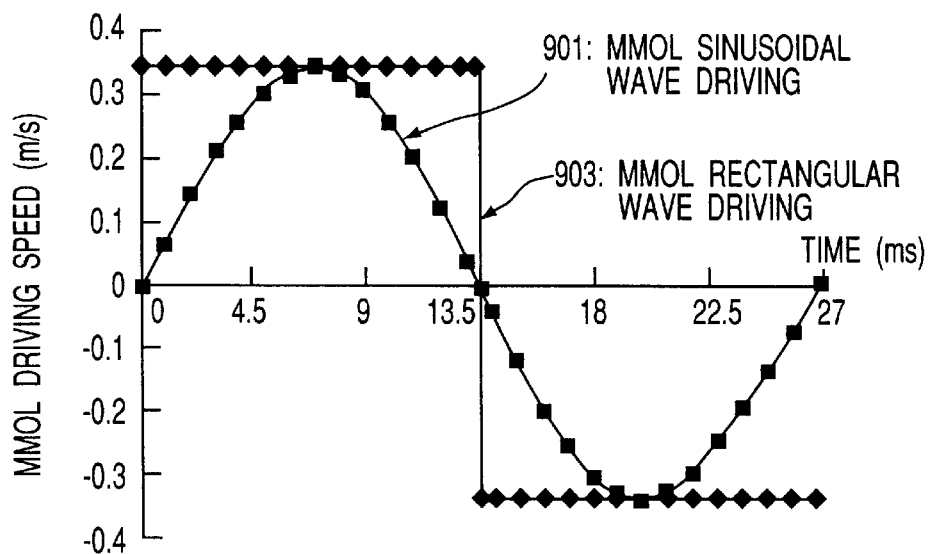
FIG. 18B is a simulated diagram showing a variation in the MMOL driving speed in the MMOL sinusoidal wave driving operation and electrostatic main deflection operation and in the hybrid deflection operation obtained by combining the above operations, for illustrating the MMOL sinusoidal wave driving operation according to the fourth embodiment.

FIGS. 18A and 18B are diagrams for illustrating the beam setting position on the wafer in the case of sinusoidal wave MMOL driving 901 in the MMOL moving direction, electrostatic main deflection 902 and hybrid deflection 904 obtained by combining the above two driving operations. FIG. 18A shows a variation in the MMOL deflection position and FIG. 18B shows a variation in the MMOL driving speed. In the example of FIGS. 17A, 17B, the driving operation in the MMOL moving direction is effected only by use of MMOL and the control by the electrostatic deflector is effected only for deflection in the traveling direction of the stage.

On the other hand, in this embodiment, the deflection control by the electrostatic deflector is also effected in the MMOL moving direction and a reduction in the drawing area by the sinusoidal wave deflection driving 901 is compensated for by use of the electrostatic main deflection 902. Thus, the hybrid driving 904 in the FIGS. 18A, 18B can be attained. By effecting the electrostatic deflection in the MMOL moving direction, the beam moving speed on the wafer of the drawing area in the MMOL moving direction becomes constant and the same area as that obtained at the time of drawing by the rectangular wave driving can be drawn.

Further, in the method, the control is effected so that the maximum value of the MMOL sinusoidal wave driving speed does not exceed the speed in the case of the rectangular wave driving. Hereinafter, this is referred to as undershoot.

Figure 19A:
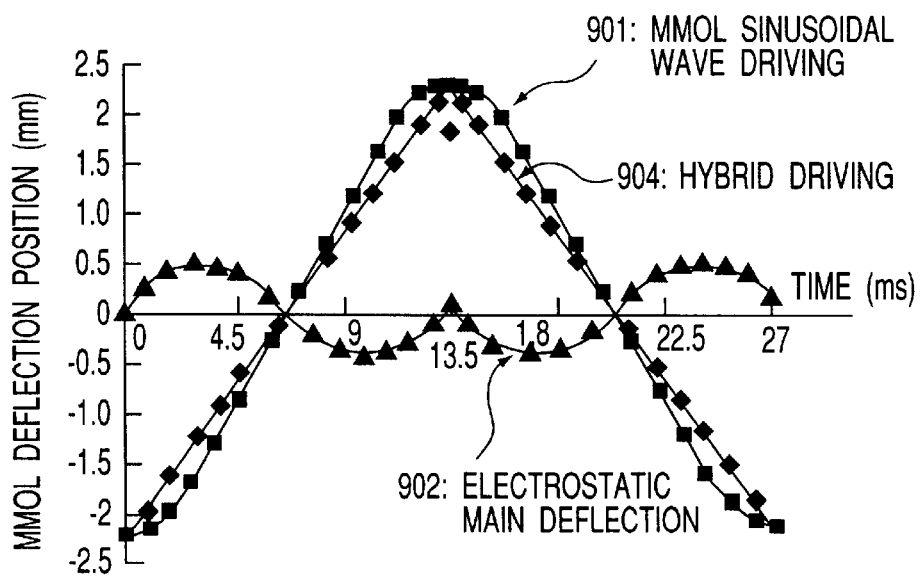
FIG. 19A is a simulated diagram showing a variation in the MMOL deflection position in the MMOL sinusoidal wave driving operation and electrostatic main deflection operation and in the hybrid deflection operation obtained by combining the above operations, for illustrating the MMOL sinusoidal wave driving operation according to the fourth embodiment.
Figure 19B:
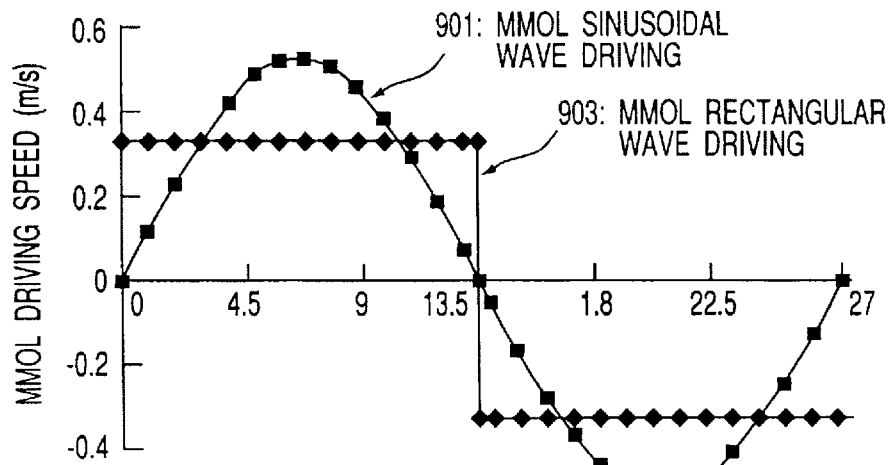
FIG. 19B is a simulated diagram showing a variation in the MMOL driving speed in the MMOL sinusoidal wave driving operation and electrostatic main deflection operation and in the hybrid deflection operation obtained by combining the above operations, for illustrating the MMOL sinusoidal wave driving operation according to the fourth embodiment.

FIGS. 19A and 19B are diagrams for illustrating the beam setting position on the wafer in the case of sinusoidal wave MMOL driving 901 in the MMOL moving direction, electrostatic main deflection 902 and hybrid deflection 904 obtained by combining the above two driving operations. FIG. 19A shows a variation in the MMOL deflection position and FIG. 19B shows a variation in the MMOL driving speed. By compensating for a reduction and increase in the drawing area by the MMOL sinusoidal wave driving 901 by use of the electrostatic deflection 902, the same drawing area as that obtained by deflection by use of the rectangular wave can be drawn by the hybrid deflection 904.

Further, in the above method, the control is effected so that the MMOL sinusoidal wave driving width becomes equal to the rectangular driving width. Hereinafter, this is referred to as overshoot.

The following Table 1 indicates the result of this embodiment obtained by combining the sinusoidal wave driving and correction by the electrostatic main deflection.

TABLE 1

| hybrid deflection width (mm) | | 4.5 mm | |
|---|---|---|---|
| MMOL | driving mode | overshoot | undershoot |
| | distance (mm) | 4.5 | 2.86 |
| | driving frequency (Hz) | 37 | 37 |
| | maximum speed (mm/s) | 520 | 333 |
| electrostatic deflection area (mm) | | 1 × 0.94 | 1 × 1.64 |
| optimum stage speed (mm/s) | | 37 | 37 |

As is understood from the above Table 1, an area of 4.5 mm can be drawn without lowering the throughput by setting the mechanical driving range to 4.5 mm and setting the electrostatic deflection area to 1 mm×0.94 mm in the case of overshoot and setting the mechanical driving range to 2.86 mm and setting the electrostatic deflection area to 1 mm×1.64 mm in the case of undershoot in comparison with the conventional case in which the area of 4.5 mm is deflected by electrostatic deflection. Further, since the electrostatic deflection area can be reduced to approx. ⅓ times the conventional case of 4.5 mm, the degree of blur and distortion of the beam can be extremely reduced.

In the pre-objective lens deflector 110, the electron beam 118 is deflected to the optical axis of the objective lens deflector 105, 106 in synchronism with the operation for mechanically moving the objective lens deflector 105, 106 in a direction perpendicular to the optical axis 119. The deflection in this case may be controlled by use of a sinusoidal wave or the like.

In the above embodiment, an electron beam drawing apparatus having a driving mechanism capable of mechanically moving the objective lens containing the objective deflector in a direction perpendicular to the optical axis and having a function of attaining the large deflection by mechanical movement and drawing each shot in the deflection area by use of the electrostatic deflection is used. In the above apparatus, a sinusoidal wave is used to mechanically drive the objective lens containing the objective-deflector, a difference between the drawing areas attained by the rectangular wave driving and the sinusoidal wave driving is corrected by the electrostatic deflector and the drawing is effected. By the above control method, the control can be made simple by mechanically moving the objective lens containing the objective deflector by the sinusoidal wave driving without lowering the throughput, the driving can be attained at high speed and the position precision of the beam can be enhanced.

The correction explained in the above embodiment is not limited to the variably forming type electron beam drawing apparatus shown in FIG. 1, but can also be effected in the character type electron beam drawing apparatus shown in FIG. 7.

(Fifth Embodiment)

Like the fourth embodiment explained before, the MMOL moving speed and stage moving speed vary according to one main deflection line area exposure time and the one main deflection line exposure time varies according to one sub-deflection exposure time. If the resist sensitivity or current density varies, one sub-deflection exposure time will vary, and therefore, it becomes necessary to change the MMOL moving speed. However, in order to make the MMOL driving section small and suppress the lowering in the degree of vacuum in the column, it is desirable to make the MMOL simple in construction. For this purpose, it is desired to effect the MMOL control by use of a single frequency. If the deflection frequency is set near the resonance frequency of MMOL, the driving power necessary for deflection becomes minimum and the miniaturization thereof can be attained.

In this embodiment, the drawing method for controlling the MMOL driving by use of a single frequency and effecting the drawing process according to a variation in exposure time is explained.

The basic construction of the electron beam drawing apparatus is the same as that shown in FIG. 1, and as shown in FIG. 3C, the driving and control process is effected by use of the objective driving mechanism 114 to move the position of the objective lens deflector 105 in a direction perpendicular to the optical axis 119. In synchronism with this movement, the electron beam 118 is controlled by the pre-objective lens deflector 110 so as to pass along the optical axis of the objective lens deflector 105 and then the shot position on thee sample surface 107 is determined by the objective lens deflector 105 and the drawing is effected.

Figure 20A:
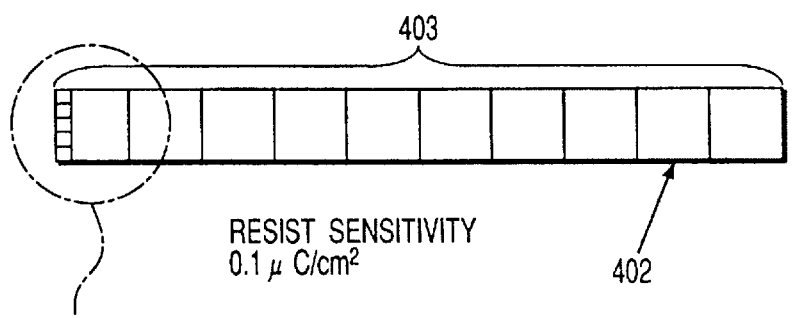
FIGS. 20A–20B are simulated diagrams showing a variation in the number of sub-deflection operations in one main deflection line caused by a variation (0.1 $\mu C/cm^2$) in the resist sensitivity, for illustrating a fifth embodiment of this invention.
Figure 20B:
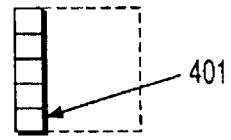

FIGS. 20A–20B show the result of drawing effected in a condition that the resist sensitivity is 0.1 $\mu C/cm^2$, the current density is 1 $A/cm^2$, the shot size is 10 $\mu m$, the sub-deflection settling time is 100 ns, the sub-deflection size is 50 $\mu m$, and the main deflection waiting time is 10 $\mu s$. In this case, in the one sub-deflection area 402, 50 shots 401 are present and, in one main deflection line 403, 10 sub-deflection areas are present. At this time, the drawing time for one main deflection line 403 is 0.15 ms. By driving MMOL in this condition, the drawing shown in FIG. 14 can be attained.

Next, a case wherein the resist sensitivity is changed is explained.

Figure 21A:
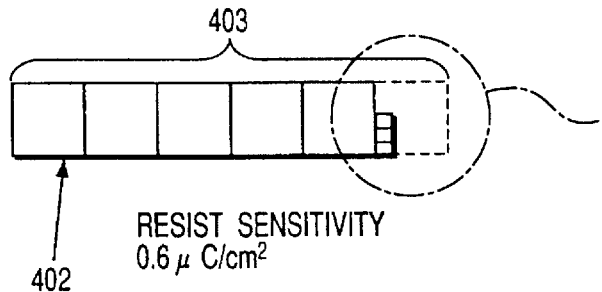
FIGS. 21A–21B are simulated diagrams showing a variation in the number of sub-deflection operations in one main deflection line caused by a variation (0.6 $\mu C/cm^2$) in the resist sensitivity, for illustrating a fifth embodiment of this invention.
Figure 21B:
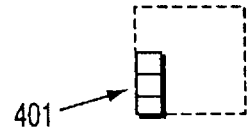

FIGS. 21A–21B show a case wherein the resist sensitivity is 0.6 $\mu C/cm^2$. The condition other than the resist sensitivity is the same as that of FIGS. 20A–20B. In this case, the shot time is derived from the equation (1) and is 600 ns and the sub-deflection drawing time is derived from the equation (2) and is 17.5 $\mu s$. At this time, in order to make the MMOL driving frequency constant, the drawing time for one main deflection line 403 is set to the same value as in a case of the resist sensitivity of 0.1 $\mu C/cm^2$. That is, the drawing time for one main deflection line 403 is set to 0.15 ms.

Under the above condition, as shown in FIGS. 21A–21B, the number of sub-deflection areas 402 in one main deflection line 403 is changed. In this case, the number of sub-deflection areas which can be drawn within 0.15 ms is derived by Nmain=0.15 ms/(17.5 $\mu s$+10 $\mu s$) which can be obtained by rewriting the equation (3) and is 5.45. That is, five sub-deflection areas 402 are drawn and the remaining time is present. It takes a time of 0.1375 ms to draw the five sub-deflection areas from the equation (3). Further, in order to draw the sixth sub-deflection area, it is necessary to change the main deflection once and set the settling time for the main deflection. Therefore, if an attempt is made to draw the area in the remaining time, the number of shots which can be drawn becomes (0.15 ms–0.1375 ms–10 $\mu s$)/700 ns=3.5 shots.

In this case, since the number of shots is smaller than the number of shots for one side or column of the sub-deflection area which is five, the drawing process is stopped and waited until the drawing time of 0.15 ms has elapsed. Therefore, when the resist sensitivity is 0.6 $\mu C/cm^2$, one main deflection line contains five sub-deflection areas and the width of the MMOL in the stage traveling direction is 250 $\mu m$. The drawing process is sequentially and continuously effected for each main deflection line.

That is, in order to set the MMOL deflection frequency constant, the number of sub-deflection areas and the number of shots are controlled to make the drawing time of one main deflection line constant. Further, if the shot time is not long enough to draw the entire surface of the sub-deflection area, shots of a number which is an integral multiple of the number of shots of one side or column of the sub-deflection area are drawn and the remaining time is set as the waiting time.

The following Table 2 shows a concrete example when the resist sensitivity varies from 0.1 $\mu C/cm^2$ to 0.5 $\mu C/cm^2$.

TABLE 2

| $Du/cm^2$ | 0.1 | 0.2 | 0.3 | 0.4 | 0.5 |
|---|---|---|---|---|---|
| $JA/cm^2$ | 1 | 1 | 1 | 1 | 1 |
| Nsub | 25 | 25 | 25 | 25 | 25 |
| tsub | 100 | 100 | 100 | 100 | 100 |
| tmain us | 10 | 10 | 10 | 10 | 10 |
| Nmain | 10 | 8.571429 | 7.5 | 6.666667 | 6 |
| nmain (integer) | 10 | 8 | 7 | 6 | 6 |
| remaining time | 0 | 0.00001 | 0.00001 | 0.00015 | 0 |
| amount drawn in remaining time | 0 | 0 | 0 | 10 | 0 |
| lines each for every 5 shots | 0 | 0 | 0 | 2 | 0 |
| remaining shots | 0 | 0 | 0 | 0 | 0 |
| remaining time | 0 | 0 | 0 | 0 | 0 |

In the Table 2, for example, when the resist sensitivity is 0.4 $\mu C/cm^2$, the number of sub-deflection areas in one main deflection line is six and the drawing is effected for 10 shots in the seventh sub-deflection area, that is, two sides or columns in the sub-deflection area. If the drawing is thus effected, the waiting time can be made minimum and a lowering in the throughput can be suppressed.

In this example, a case wherein the resist sensitivity is changed is explained, but the same explanation can be made in a case wherein the current density is changed.

Thus, in this embodiment, in the electron beam drawing apparatus having the driving mechanism capable of mechanically moving the objective lens containing the objective deflector in a direction perpendicular to the optical axis and having a function of attaining the large deflection by mechanical movement and drawing each shot in the deflection area by use of the electrostatic deflection, the number of sub-deflection areas and the number of shots are controlled to make the drawing time of one main deflection line constant. Further, if the shot time is not long enough to draw the entire surface of the sub-deflection area, shots of a number which is an integral multiple of the number of shots of one side or column of the sub-deflection area are drawn and the remaining time is set as the waiting time. Thus, it becomes possible to control the driving operation by use of a constant MMOL driving frequency with respect to a variation in the resist sensitivity and current density and effect the MMOL control operation by use of a single frequency. Therefore, it becomes possible to set the deflection frequency near the resonance frequency of the MMOL, thereby making it possible to set the driving power necessary for deflection minimum and make the apparatus small.

The idea of this embodiment can be applied to the character projection system shown in FIG. 7.

(Sixth Embodiment)

The basic construction of the electron beam drawing apparatus used in this embodiment is the same as that shown in FIG. 1 and the explanation therefor is omitted.

In the fourth embodiment described before, time of 4.5 ms is required for the drawing of one MMOL column, and at this time, the optimum MMOL moving speed is 1.5 mm/4.5 ms=333 mm/s.

The MMOL position can be detected with a high precision of 0.6 nm by use of an interferometer. The position data is updated at a sampling period of 100 ns and data can be read out in response to a strobe signal for every 100 ns. The readout position information is supplied to the pre-objective deflector 110. That is, the position information is fed back to the deflection voltage to control the electron beam 118 so as to pass along the optical axis of the objective lens deflector 105. Further, the readout position information is fed back to the deflection voltage applied to the objective lens deflector 105 to determine the shot position on the sample surface 107.

Figure 22:
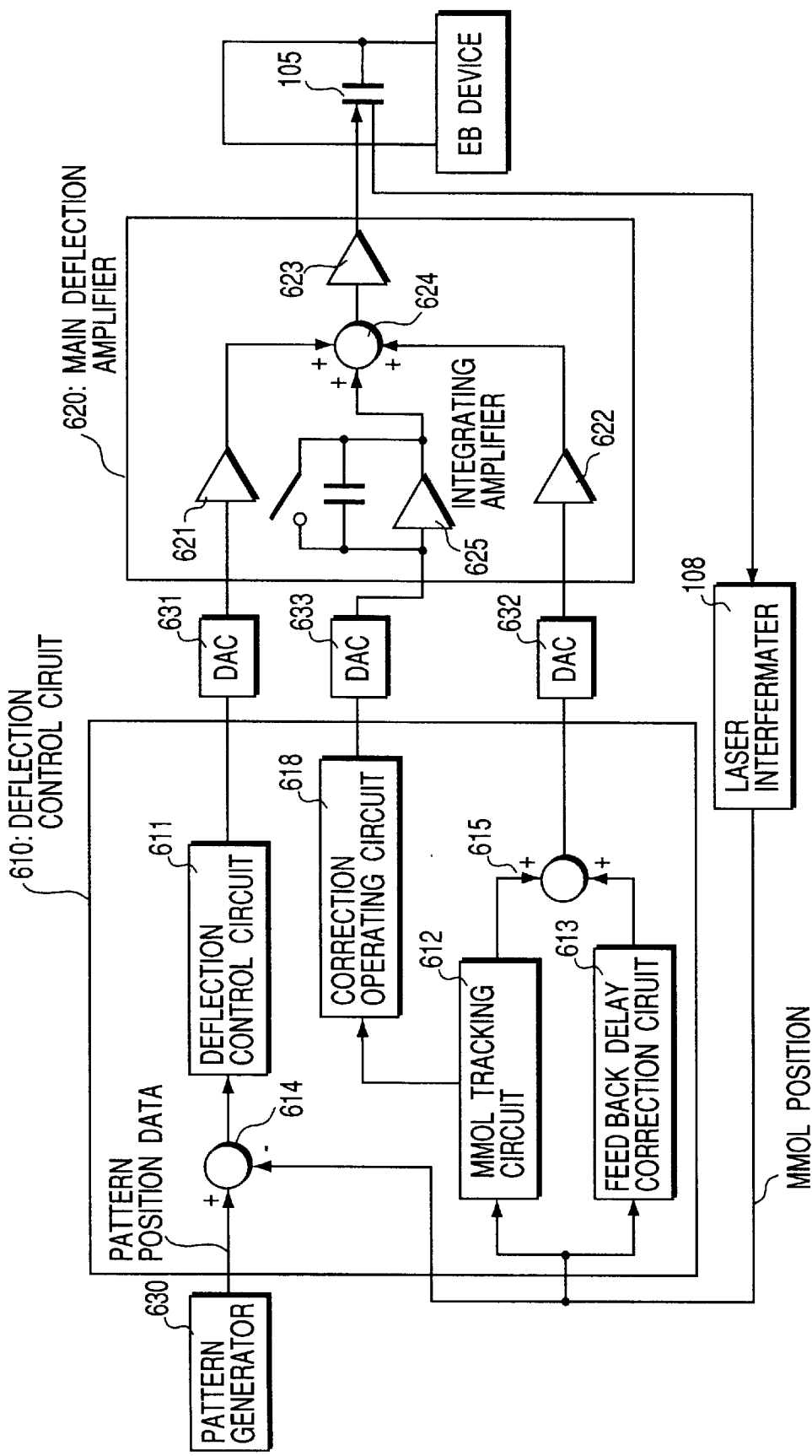
FIG. 22 is a circuit construction diagram showing an MMOL tracking circuit according to a sixth embodiment of this invention.

FIG. 22 shows the construction of an MMOL follow-up control circuit of this embodiment. The circuit includes a deflection control circuit 610 and main deflection amplifier 620. The deflection control circuit 610 includes a main deflection distortion correction circuit 611, MMOL tracking circuit 612, feedback delay correction circuit 613, subtracter 614, adder 615 and correction operating circuit 618 which will be described later. Pattern position data from a pattern generator 630 and MMOL position data from a laser length interferometer 108 are supplied to the main deflection distortion correction circuit 611 via the subtracter 614. Further, the MMOL position data from the laser length measuring machine 108 is supplied to the MMOL follow-up circuit 612 and feedback delay correction circuit 613 and outputs of the respective circuits 612, 613 are added together by the adder 615.

The main deflection amplifier 620 includes amplifiers 621, 622, 623, adder 624 and integrator 625 which will be described later. Correction data from the main deflection distortion correction circuit 611 of the deflection control circuit 610 is supplied to the amplifier 621 via a DAC 631. Further, a signal from the adder 615 of the deflection control circuit 610 is supplied to the amplifier 622 via a DAC 632. Outputs of the respective amplifiers 621, 622 are added together by the adder 624 whose output is supplied to the main deflector of the objective deflector 105 via the amplifier 623.

If neither of the correction operating circuit 618 and integrating amplifier 625 is provided, position data updated for every 100 ns is detected in a period of time from the start of the main deflection position determining process to the end of the drawing in the sub-deflection area in the deflection control circuit 610 and a difference immediately after the main deflection position determining process is derived by the MMOL tracking circuit 612. A tracking error depending on the MMOL moving speed caused by delay time of the MMOL tracking circuit 612 is derived by the MMOL feedback delay correction circuit 613. Then, data obtained by adding outputs of the circuits 612, 613 together is written into the MMOL tracking DAC 632 and a voltage output thereof is added to the objective deflection voltage to correct the position of the beam.

In this case, data written into the MMOL follow-up DAC 632 varies in a step form as shown by broken lines in FIG.

23. When the MMOL moving speed is low, any factor for degrading drawing information does not occur. However, if MMOL is drawn while the moving speed is set at 333 mm/s, MMOL moves by 33 nm in a sampling period of 100 ns and the beam position cannot be controlled during this period of time, thereby lowering the drawing precision.

Therefore, in this embodiment, by providing the correction operating circuit 618, integrating amplifier 625 and DAC 633 in addition to the above construction, changes of positions in the sampling period are derived by interpolation based on MMOL position information obtained in a constant sampling period so as to finely correct the beam position.

In this case, the beam position is detected by use of the laser interferometer 108 with the resolution of 0.6 nm and position data can be obtained together with a strobe signal as position information for every 100 ns. Like the former example, position data updated for every 100 ns is detected in a period of time from the start of the main deflection position determining process to the end of the drawing in the sub-deflection area and a difference immediately after the main deflection position determining process and a tracking error depending on the MMOL moving speed caused by delay time of the MMOL tracking circuit are derived. Then, data obtained by adding the two outputs together is written into the MMOL tracking DAC 632.

Further, the MMOL moving speed (=MMOL traveling distance/sampling time) is detected and held based on a plurality of position data items detected during a period of time in which the drawing process is not effected in a period of main deflection settling time immediately after the main deflection position determining process by use of the correction operating circuit 618. The speed data is input to the integrating amplifier 625 of the main deflection amplifier 620 via the DAC 633 to generate an interpolated voltage (interpolated position data). Then, after the integrating amplifier 625 is cleared at the position data updating time for every 100 ns, the detected MMOL moving speed is input to the integrating amplifier 625 and an output voltage thereof is added to the outputs of the amplifiers 621, 622 by the adder 624.

As a result, the final output of the MMOL tracking control circuit takes a linear form as shown by the solid line in FIG. 23 and the beam position in the sampling time can follow the movement of MMOL with high precision.

(Seventh Embodiment)

The MMOL tracking integrating amplifier in the sixth embodiment can be formed with the following construction. That is, the MMOL moving speed is previously derived with high precision based on the sampling time and the MMOL position variation amount sampled in the main deflection settling time. Then, immediately before the end of the main deflection settling process, an MMOL position variation amount in a period of time from the start of the main deflection position determining process is set as an offset value and MMOL moving speed data obtained at this time is input to the integrating amplifier. Further, the beam position is corrected based on the added value of two data items until the drawing process in the sub-deflection area is terminated. For the next sub-deflection drawing process, the integrating amplifier is reset and the same control operation is effected.

There is provided a method for using an output of the conventional tracking DAC amplifier updated for every 100 ns as a reference voltage in order to enhance the precision of the integrating amplifier. In this case, an output of the integrating amplifier is sampled and held and compared with a reference voltage at the position data updating time and a difference voltage therebetween is fed back to the input of the integrating amplifier, thereby making it possible to enhance the precision.

If the MMOL moving speed is already determined, the MMOL movement is expressed in a table form and the correction process can be effected based on the table.

(Modification)

This invention is not limited to the above embodiments. In the above embodiments, the variably forming type electron beam drawing apparatus and character type electron beam drawing apparatus are explained, but this invention can also be applied a point type electron beam drawing apparatus. Further, this invention is not limited to the electron beam drawing apparatus, but can be applied a drawing apparatus in which a beam is electrically deflected and can be applied an ion beam drawing apparatus. In addition, this invention is not limited to a drawing apparatus, but can be applied to a measuring apparatus such as SEM.

In the third embodiment, the number of opening patterns formed in the shaping apertures and character apertures moved by the driving mechanism and the arrangement relation thereof can be adequately changed according to the specification. Further, in the fourth embodiment, the waveform for controlling the driving mechanism for the objective lens and the like is not limited to the sinusoidal waveform, but any waveform which can be used to smoothly drive the objective lens or the like in a manner of trigonometric function can be used. In addition, this invention can be variously modified without departing from the technical scope thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged beam drawing apparatus comprising:
   a condenser lens for adjusting a charged beam emitted from a charged beam source to have a desired size and brightness;
   an objective lens for focusing the charged beam on a sample surface;
   an objective deflector for controlling a position of the charged beam on the sample surface;
   a driving mechanism for mechanically moving said objective lens and objective deflector in a preset plane; and
   an optical axis shifting deflector arranged nearer to the charged beam source than said objective lens and objective deflector, for deflecting the charged beam in synchronism with an operation of said driving mechanism, wherein said driving mechanism mechanically and reciprocally moves said objective lens and objective deflector in the preset plane to continuously change moving speed of said objective lens and objective deflector.

2. The charged beam drawing apparatus according to claim 1, wherein said driving mechanism receives a driving signal having a sinusoidal wave.

3. The charged beam drawing apparatus according to claim 1, wherein a difference between a constant reference speed and the moving speed of said driving mechanism is compensated by electrically deflecting the charged beam by use of said objective deflector in synchronism with the operation of said driving mechanism.

4. The charged beam drawing apparatus according to claim 1, wherein a frequency of a driving signal for said driving mechanism is constant.

5. The charged beam drawing apparatus according to claim 4, wherein said objective deflector includes two stages of main deflector and sub-deflector having a sub-deflection area, the position of the sub-deflection area is determined by said main deflector, the sub-deflection area is drawn by the sub-deflector, a stage on which the sample is placed is continuously moved in one direction, a moving direction by said driving mechanism is a direction intersecting the one direction, and the number of shots and the number of sub-deflection areas in a main deflection line are variably controlled according to a drawing condition to make constant the drawing time of the main deflection line containing a plurality of sub-deflection areas along a direction intersecting the one direction.

6. A charged beam drawing apparatus comprising:

a condenser lens for adjusting a charged beam emitted from a charged beam source to have a desired current density;

a character mask having a plurality of different aperture patterns, to form the charged beam having a shape corresponding to select one of the aperture patterns;

an objective lens for forming an image on a sample surface based on the charged beam formed by said character mask;

an objective deflector for controlling the position of the charged beam on the sample surface;

a driving mechanism for moving said character mask, objective lens and objective deflector in a preset plane; and an optical axis shifting deflector arranged nearer to the charged beam source than said character mask, for deflecting the charged beam in synchronism with an operation of said driving mechanism, wherein said driving mechanism reciprocally moves said character mask, objective lens and objective deflector in a preset plane to continuously change the moving speeds of said character mask, objective lens and objective deflector.

7. The charged beam drawing apparatus according to claim 6, wherein said driving mechanism receives a driving signal having a sinusoidal wave.

8. The charged beam drawing apparatus according to claim 6, wherein a difference between a constant reference speed and the moving speed of said driving mechanism is compensated by electrically deflecting the beam by use of said objective deflector in synchronism with the operation of said driving mechanism.

* * * * *